(12) United States Patent
Jones

(10) Patent No.: US 7,406,584 B2
(45) Date of Patent: Jul. 29, 2008

(54) IC COMPRISING NETWORK OF MICROPROCESSORS COMMUNICATING DATA MESSAGES ALONG ASYNCHRONOUS CHANNEL SEGMENTS USING PORTS INCLUDING VALIDITY AND ACCEPT SIGNAL REGISTERS AND WITH SPLIT / JOIN CAPABILITY

(75) Inventor: Anthony Mark Jones, Portland, OR (US)

(73) Assignee: Ambric, Inc., Beaverton, OR (US)

( * ) Notice: Subject to any disclaimer, the term of this patent is extended or adjusted under 35 U.S.C. 154(b) by 0 days.

(21) Appl. No.: 11/466,083

(22) Filed: Aug. 21, 2006

(65) Prior Publication Data

US 2006/0282812 A1 Dec. 14, 2006

Related U.S. Application Data

(62) Division of application No. 10/871,347, filed on Jun. 18, 2004, now Pat. No. 7,206,870.

(60) Provisional application No. 60/479,759, filed on Jun. 18, 2003.

(51) Int. Cl.
*G06F 15/17* (2006.01)
(52) U.S. Cl. .......................... 712/32; 712/200; 712/201
(58) Field of Classification Search ........................ None
See application file for complete search history.

(56) References Cited

U.S. PATENT DOCUMENTS 4,914,574 A 4/1990 Terada et al.

5,404,428 A 4/1995 Wu
5,745,124 A 4/1998 Parks et al.
5,778,059 A 7/1998 Loghmani et al.

(Continued)

FOREIGN PATENT DOCUMENTS

EP 0772140 A1 7/1997

(Continued)

OTHER PUBLICATIONS van der Hoeven, et al., A. J., A Hardware Design System based on Object-Oriented Principles, 1991 IEEE Computer Society Press, pp. 459-463.

(Continued)

*Primary Examiner*—Kenneth S Kim
(74) *Attorney, Agent, or Firm*—Marger Johnson & McCollom, P.C.

(57) ABSTRACT

Embodiments of the invention are directed to a communication network on an integrated circuit for a number of interconnected microprocessors. The network is made from a number of sending nodes and receiving nodes each coupled by a communication channel. Individual communication channels operate at individually controllable clock speeds. Data messages sent between nodes pass at the speed of the communication channels. These data messages are sent by a sending port that includes registers for storing data and registers for protocol signals that control the timing and movement of the data. Data crosses clock boundaries without data loss. At least some of the microprocessors include fork functions that output a data stream to more than one output port. Similarly, at least some of the microprocessors include join functions that can create a single data stream from inputs from more than one input port.

25 Claims, 28 Drawing Sheets

U.S. PATENT DOCUMENTS

| | | | |
|---|---|---|---|
| 5,867,399 | A | 2/1999 | Rostoker et al. |
| 5,870,588 | A | 2/1999 | Rompaey et al. |
| 5,907,692 | A | 5/1999 | Wise et al. |
| 6,025,853 | A | 2/2000 | Baldwin |
| 6,044,211 | A | 3/2000 | Jain |
| 6,075,935 | A | 6/2000 | Ussery et al. |
| 6,078,962 | A | 6/2000 | Chappel et al. |
| 6,092,174 | A | 7/2000 | Roussakov |
| 6,105,083 | A * | 8/2000 | Kurtze et al. ................ 710/29 |
| 6,112,017 | A | 8/2000 | Wise |
| 6,112,304 | A | 8/2000 | Clawson |
| 6,138,228 | A | 10/2000 | Douday |
| 6,145,073 | A | 11/2000 | Cismas |
| 6,150,807 | A | 11/2000 | Osann, Jr. |
| 6,230,307 | B1 | 5/2001 | Davis et al. |
| 6,233,540 | B1 | 5/2001 | Schaumont et al. |
| 6,263,422 | B1 | 7/2001 | Wise et al. |
| 6,289,488 | B1 | 9/2001 | Dave et al. |
| 6,292,925 | B1 | 9/2001 | Dellinger et al. |
| 6,298,472 | B1 | 10/2001 | Phillips et al. |
| 6,308,229 | B1 | 10/2001 | Masteller |
| 6,330,659 | B1 | 12/2001 | Poff et al. |
| 6,353,841 | B1 | 3/2002 | Marshall et al. |
| 6,370,681 | B1 | 4/2002 | Dellarocas et al. |
| 6,435,737 | B1 | 8/2002 | Wise et al. |
| 6,467,009 | B1 | 10/2002 | Winegarden et al. |
| 6,473,769 | B1 | 10/2002 | Andrew et al. |
| 6,477,683 | B1 | 11/2002 | Killian et al. |
| 6,477,697 | B1 | 11/2002 | Killian et al. |
| 6,483,343 | B1 | 11/2002 | Faith et al. |
| 6,484,304 | B1 | 11/2002 | Ussery et al. |
| 6,507,947 | B1 | 1/2003 | Schrieber et al. |
| 6,553,395 | B2 | 4/2003 | Marshall et al. |
| 6,597,664 | B1 | 7/2003 | Mithal et al. |
| 6,598,177 | B1 * | 7/2003 | Jones et al. ................ 714/30 |
| 6,606,588 | B1 | 8/2003 | Schaumont et al. |
| 6,622,233 | B1 | 9/2003 | Gilson |
| 6,633,181 | B1 | 10/2003 | Rupp |
| 6,653,859 | B2 | 11/2003 | Sihlbom et al. |
| 6,654,889 | B1 | 11/2003 | Trimberger |
| 6,658,005 | B2 | 12/2003 | Seidel et al. |
| 6,701,515 | B1 | 3/2004 | Wilson et al. |
| 6,762,630 | B2 * | 7/2004 | Fibranz et al. ................ 327/141 |
| 6,763,034 | B1 | 7/2004 | Jones et al. |
| 6,763,327 | B1 | 7/2004 | Songer et al. |
| 6,765,407 | B1 | 7/2004 | Snyder |
| 6,769,056 | B2 | 7/2004 | Barry et al. |
| 6,775,766 | B2 | 8/2004 | Revilla et al. |
| 6,795,882 | B1 * | 9/2004 | Kommrusch ................ 710/100 |
| 6,795,909 | B2 | 9/2004 | Barry et al. |
| 6,816,562 | B2 | 11/2004 | Atkinson et al. |
| 6,826,674 | B1 | 11/2004 | Sato |
| 6,836,839 | B2 | 12/2004 | Master et al. |
| 6,847,686 | B2 | 1/2005 | Morad et al. |
| 6,850,092 | B2 | 2/2005 | Chelcea et al. |
| 6,857,110 | B1 | 2/2005 | Rupp et al. |
| 6,877,150 | B1 | 4/2005 | Miller et al. |
| 6,889,310 | B2 | 5/2005 | Cismas |
| 7,080,183 | B1 | 7/2006 | Vaidyanathan et al. |
| 7,139,985 | B2 | 11/2006 | Jones |
| 2001/0025363 | A1 | 9/2001 | Ussery et al. |
| 2002/0016918 | A1 | 2/2002 | Tucker et al. |
| 2002/0100030 | A1 | 7/2002 | Souloigiou et al. |
| 2002/0122424 | A1 | 9/2002 | Kawarai et al. |
| 2002/0124012 | A1 | 9/2002 | Liem et al. |
| 2002/0126621 | A1 | 9/2002 | Johnson et al. |
| 2002/0128037 | A1 | 9/2002 | Schmidt |
| 2002/0129340 | A1 | 9/2002 | Tuttle |
| 2002/0138716 | A1 | 9/2002 | Master et al. |
| 2002/0181559 | A1 | 12/2002 | Heidari-Bateni et al. |
| 2003/0054774 | A1 | 3/2003 | Plunkett et al. |
| 2003/0056084 | A1 | 3/2003 | Holgate et al. |
| 2003/0208723 | A1 | 11/2003 | Killian et al. |
| 2003/0229482 | A1 | 12/2003 | Cook et al. |
| 2004/0001296 | A1 | 1/2004 | Saito et al. |
| 2004/0001445 | A1 | 1/2004 | Stansfield |
| 2004/0068640 | A1 | 4/2004 | Jacobson et al. |
| 2004/0078548 | A1 | 4/2004 | Claydon et al. |
| 2004/0125665 | A1 * | 7/2004 | Chelcea et al. ................ 365/200 |
| 2004/0141510 | A1 | 7/2004 | Blanc et al. |
| 2004/0193763 | A1 | 9/2004 | Lizuka et al. |
| 2004/0194048 | A1 | 9/2004 | Arnold |
| 2004/0243984 | A1 | 12/2004 | Vorbach et al. |
| 2005/0021749 | A1 * | 1/2005 | Donlin et al. ................ 709/225 |
| 2005/0076187 | A1 | 4/2005 | Claydon |

FOREIGN PATENT DOCUMENTS

| | | |
|---|---|---|
| EP | 1074912 | 2/2001 |
| GB | 1028139 | 4/1966 |
| JP | 3269728 | 12/1991 |
| WO | 99/39288 B1 | 8/1999 |
| WO | 02/080044 B1 | 10/2002 |

OTHER PUBLICATIONS

Grimpe, Eike and Oppenheimer, Frank, Object-Oriented High Level Synthesis Based on SystemC, 2001 IEEE, pp. 529-534.

Kuhn et al., T., Object Oriented Hardware Synthesis and Verification, ISSS'01, Oct. 1-3, 2001, Montreal, Quebec, Canada.

Lu, et al., "Performance Analysis and Efficient Implementation of Latency Insensitive Systems," Technical Report TR-ECE03-06, Mar. 2003, XP002337839, School of Electrical & Computer Engineering, Purdue University, p. 1, second paragraph, section 5.

Chelcea, T., et al., "A low-latency FIFO for mixed-clock systems," IEEE Comput Society, Apr. 27, 2000, pp. 119-126, XP010379677, Proceedings IEEE Computer Society Workshop on VLSI 2000. System Design for a System-on-Chip, Era, p. 3, right column, third paragraph, sections 4 and 5.

Carloni, L.P. et al., "A methodology for correct-by-construction latency insensitive design," Computer-Aided Design, 1999, Digest of Technical Papers, 1999 IEEE/ACM International Conference, San Jose, CA, USA Nov. 7-11, 1999, Piscataway, NJ, USA, IEEE, US Nov. 7, 1999, pp. 309-315, XP010363870, ISBN: 0-7803-5832-5, abstract Sections 2, 5 and 6, figure 5.

Ruibing, Lu, et al.: "Performance Optimization of Latency Insensitive Systems through Buffer Queue Sizing of Communication Channels," IEEE/ACM International Conference on Computer Aided Design, ICCAD 2003. IEEE/ACM Digest of Technical Papers, San Jose, CA, Nov. 9-13, 2003, IEEE/ACM International Conference on Computer-Aided Design, New York, NY; ACM, US Nov. 9, 2003, pp. 227-231, XPO10677157, ISBN: 1-58113-762-1, left-hand column, paragraph 1-p. 1, right-hand column, paragraph 2.

Casu, M.R., et al.: "Issues in Implementing Latency Insensitive Protocols," Design, Automation and Test in Europe Conference and Exhibition, 2004. Proceeding Feb. 16-20, 2004, Piscataway, NJ, USA, IEEE, vol. 2, Feb. 16, 2004, pp. 1390-1391, XPO10684987, ISBN: 0-7695-2085-5, p. 1, left-hand column, line 1—p. 1, right-hand column, line 3.

Chandranmenon, G.P., et al: "Reconsidering Fragmentation and Reassembly," Proceedings of the 17th Annual ACM Symposium on Principles of Distributed Computing PODC 1998, Puerto Vallarta, Mexico, Jun. 28-Jul. 2, 1998, ACM Sigact—Sigmod Symposium on Principles of Distributed Computing, New York, NY: ACM; US, Jun. 28, 1998, pp. 21-29, XP002921718 ISBN: 0-89791-877-7; abstract, lines 1-6.

Jacobson, Hans M., et al., "Synchronous Interlocked Pipelines," Proc. Eighth International Symposium on Asynchronous Circuits and Systems, (ASYNC'02) IEEE, 2002, pp. 1-10.

* cited by examiner

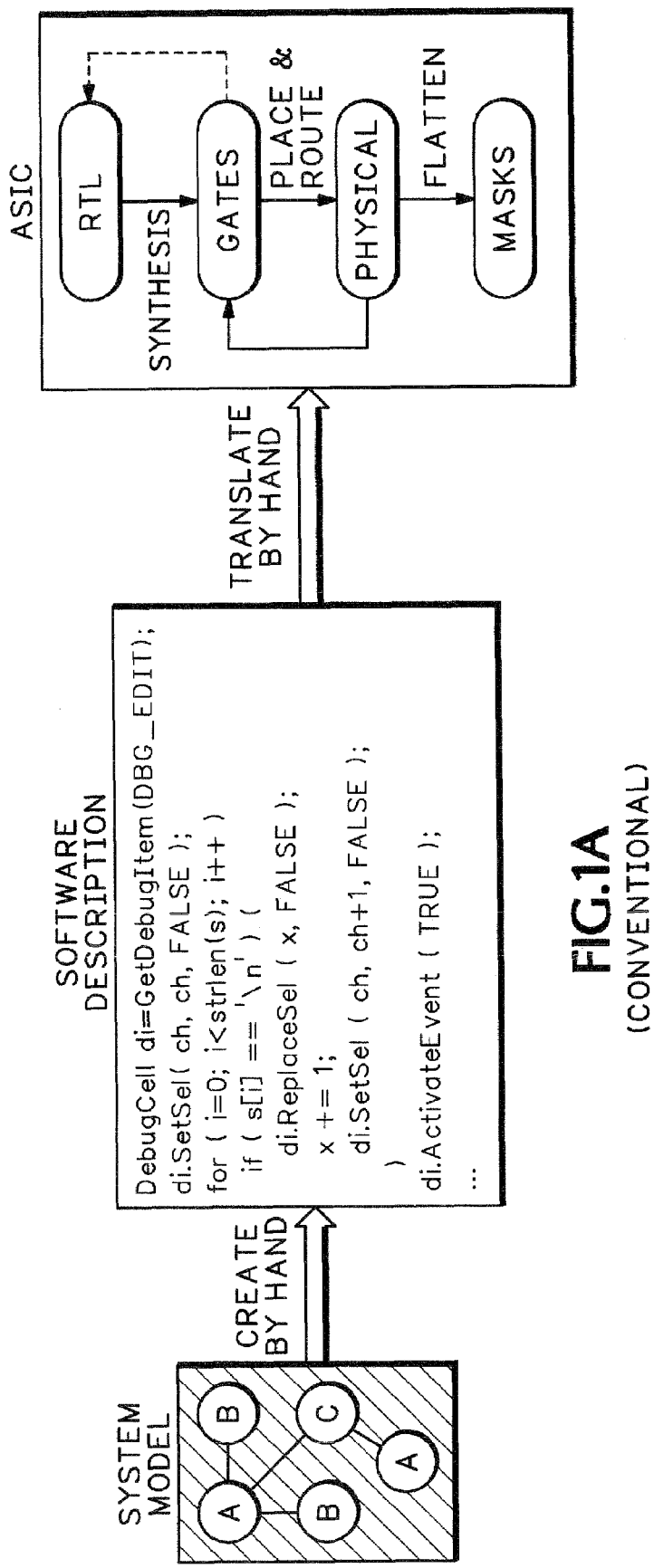
FIG.1A
(CONVENTIONAL)

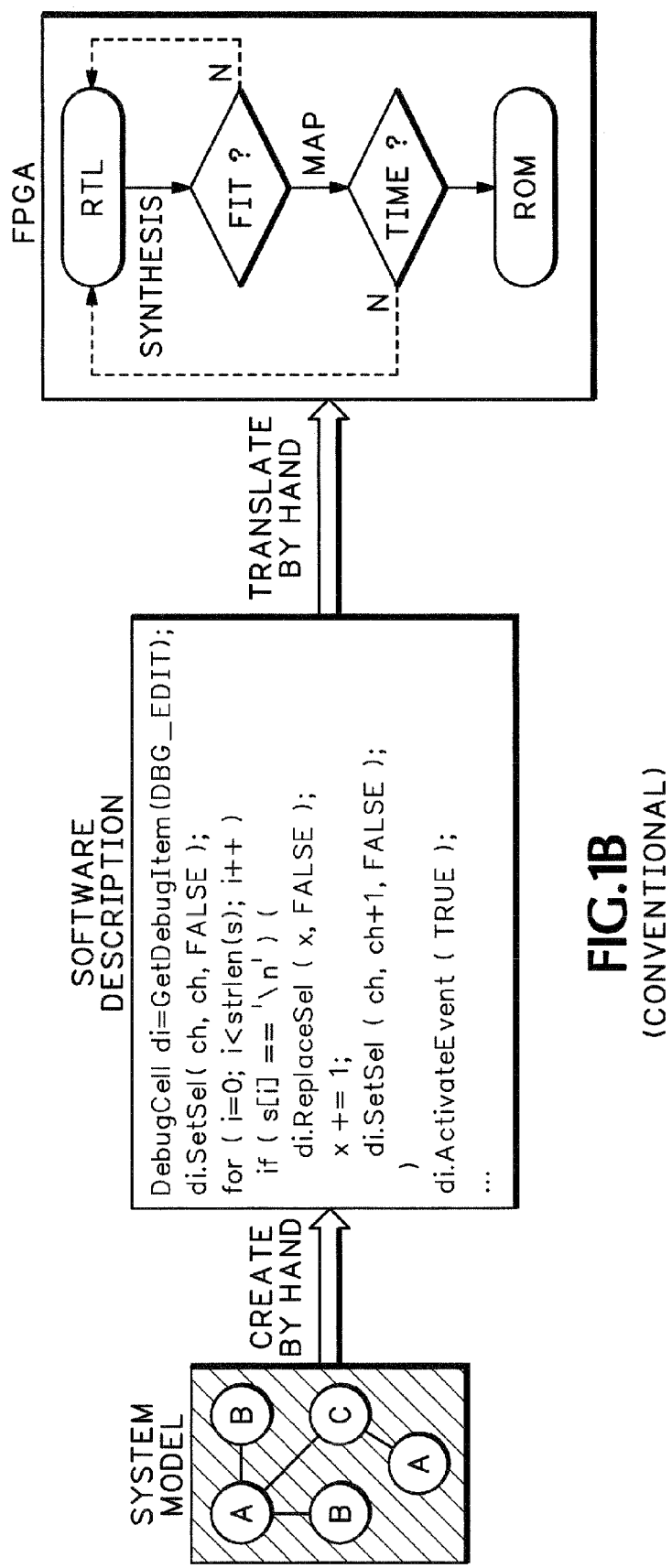
FIG.1B (CONVENTIONAL)

PACKET A

| packet_id | 0 | X | 1 | X | X | 1 | X | X | 1 | 1 |
|---|---|---|---|---|---|---|---|---|---|---|
| valid | 1 | 0 | 1 | 0 | 0 | 1 | 0 | 0 | 1 | 1 |
| | A5 | | A4 | | | A3 | | | A2 | A1 |

PACKET B

| packet_id | X | X | 0 | 1 | 1 | 1 | X | X | X | 1 |
|---|---|---|---|---|---|---|---|---|---|---|
| valid | 0 | 0 | 1 | 1 | 1 | 1 | 0 | 0 | 0 | 1 |
| | | | B5 | B4 | B3 | B2 | | | | B1 |

| CLOCK | ACCEPT | WAIT FOR | OUTPUT |
|---|---|---|---|
| T1 | A1,B1 | | A1+B1 |
| T2 | A2 | B2 | |
| T3 | | B2 | |
| T4 | | B2 | |
| T5 | A3,B2 | B3 | A2+B2 |
| T6 | B3 | | A3+B3 |
| T7 | B4 | A4 | |
| T8 | A4,B5 | A5 | A4+B4 |
| T9 | | A5 | |
| T10 | A5 | | A5+B5 |

TABLE 1: ADDING PACKET A TO PACKET B

FIG.11

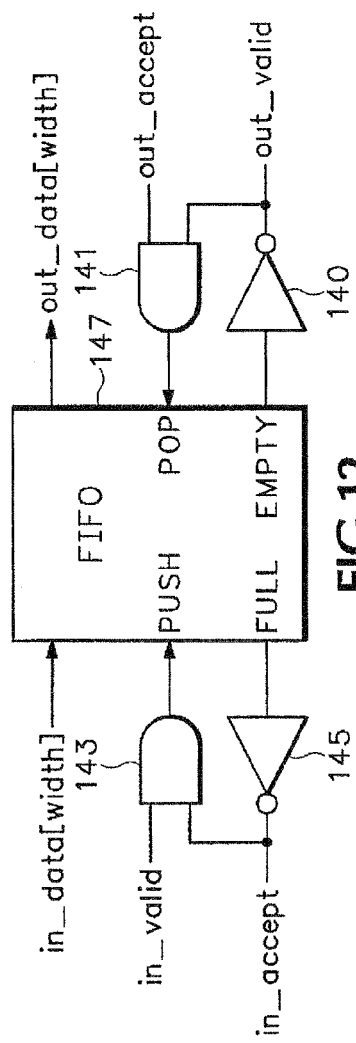
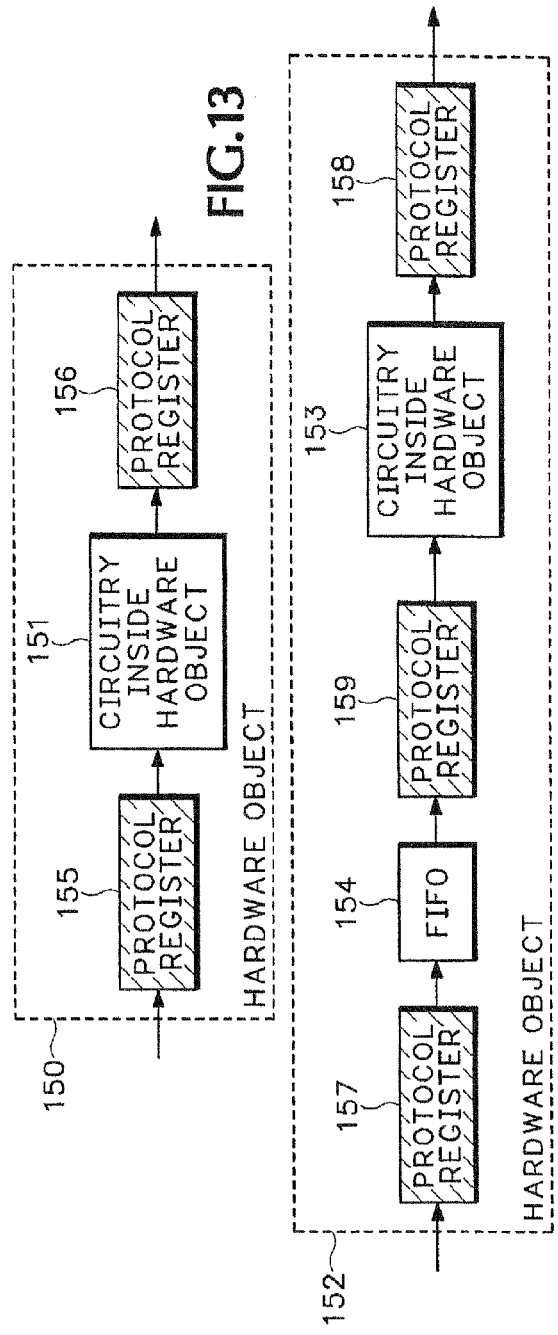
FIG.12
FIG.13

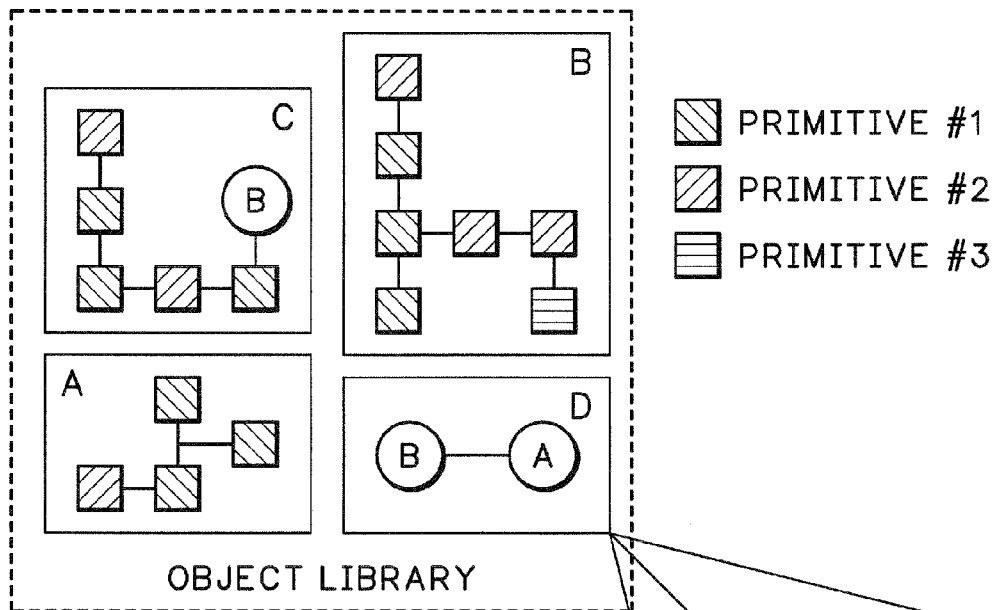
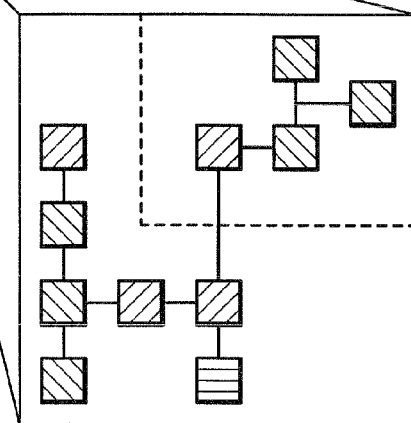
FIG.26
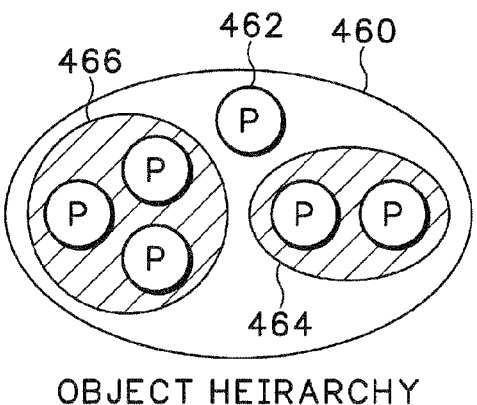
FIG.27

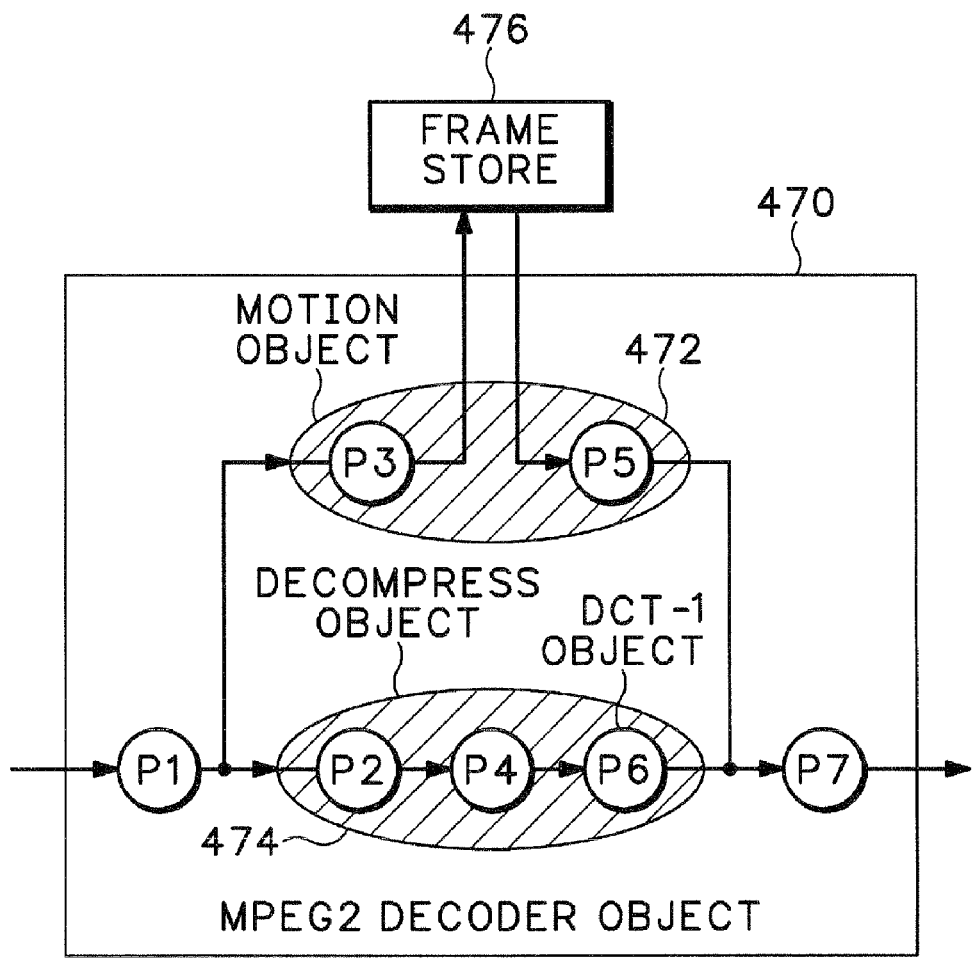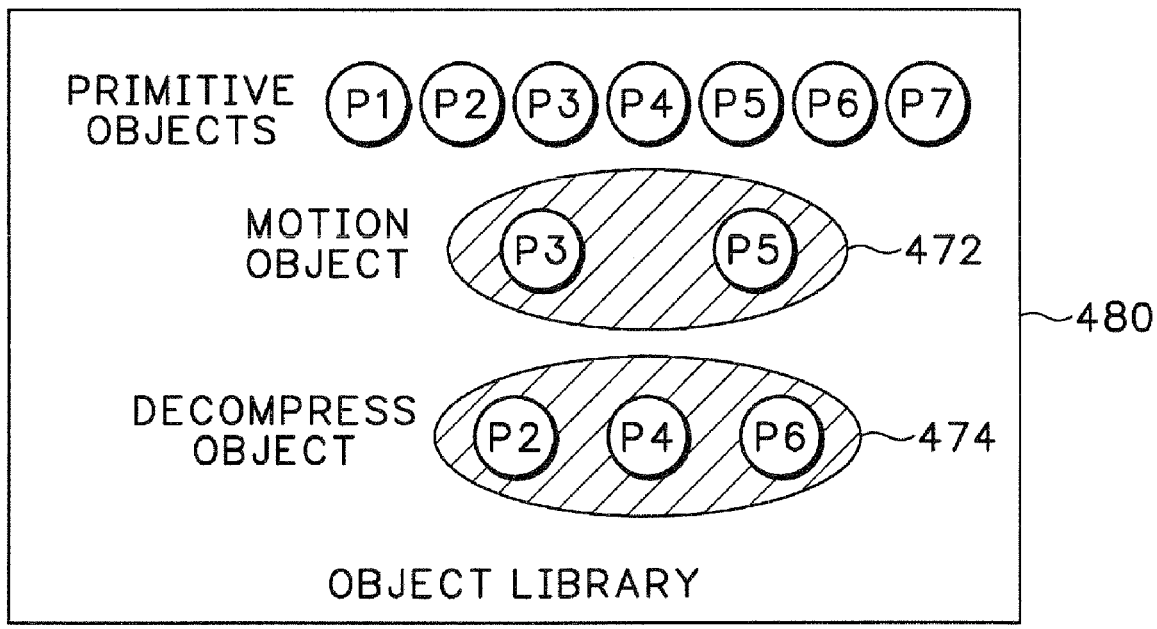
FIG. 28

```
PROCEDURE Convolve
   INPORT   a, b, c: TYPE Channel;
   OUTPORT  d, e, f: TYPE Channel;

VAR ui, wi, yi: TYPE Integer;
   join(a→ui, b→wi);   // does not complete until both
                       // channels a and b are valid
   d←ui;               // copy u(i) to become u(i+1)
   e←wi;               // copy w(i) to become w(i+1)
   c→yi;               // does not complete until
                       // channel c is valid
   f←(ui*wi+yi);       // y(i+1) = u(i)*w(i) + y(i)
ENDPROCEDURE
```

PSEDUDO-CODE FOR THE CONVOLUTION PRIMITIVE

FIG.33

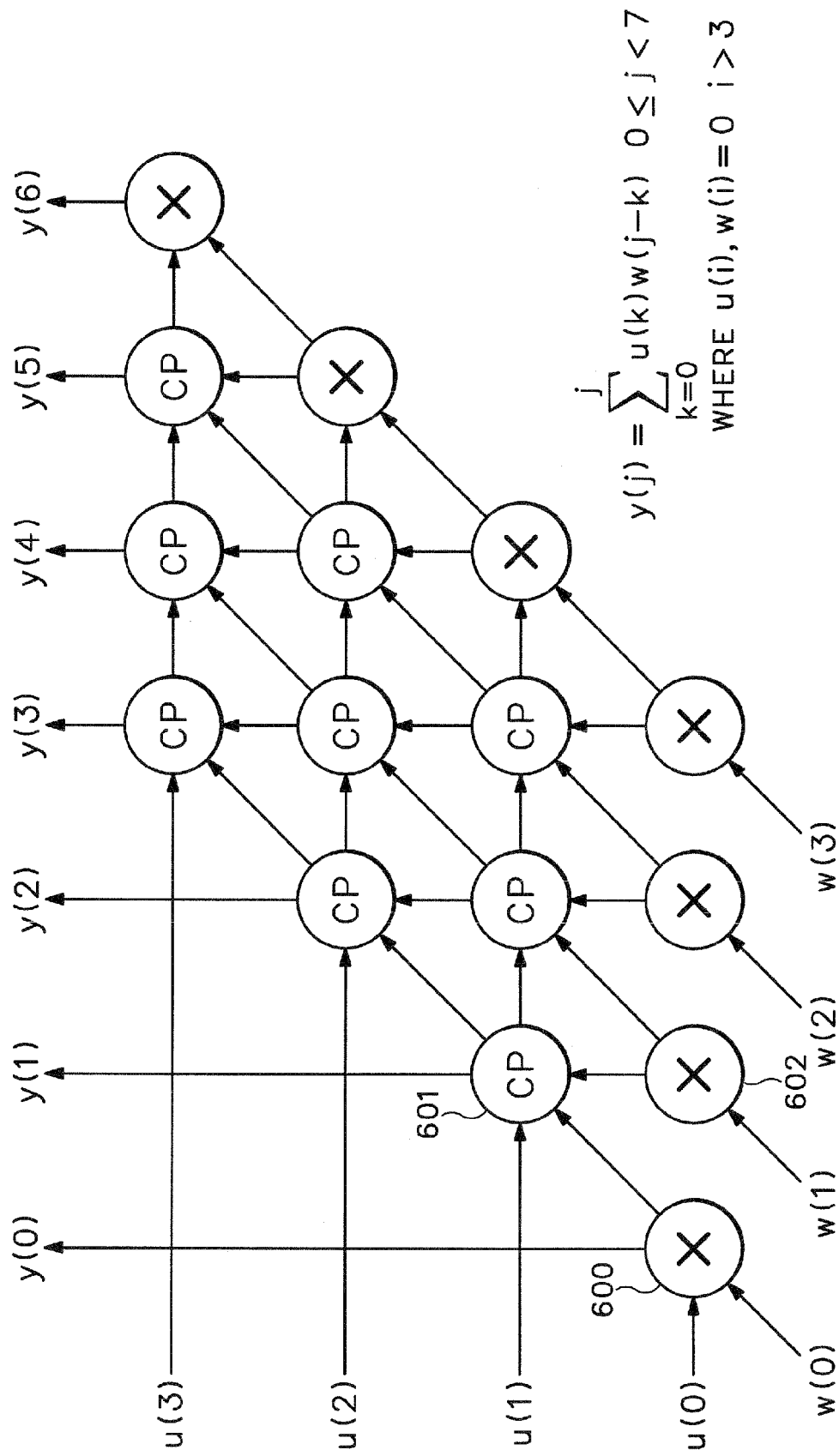
FIG.35 CONVOLUTION OF TWO SEQUENCES
$$y(j) = \sum_{k=0}^{j} u(k)w(j-k) \quad 0 \leq j < 7$$
WHERE $u(i), w(i) = 0 \quad i > 3$

IC COMPRISING NETWORK OF MICROPROCESSORS COMMUNICATING DATA MESSAGES ALONG ASYNCHRONOUS CHANNEL SEGMENTS USING PORTS INCLUDING VALIDITY AND ACCEPT SIGNAL REGISTERS AND WITH SPLIT / JOIN CAPABILITY

CROSS REFERENCE TO RELATED APPLICATIONS

This application claims priority from and is a division of application U.S. patent application Ser. No. 10/871,347, entitled Data Interface for Hardware Objects, filed on Jun. 18, 2004, now issued as U.S. Pat. No. 7,206,870, which itself claims priority from United States Provisional patent application 60/479,759, filed Jun. 18, 2003, entitled Integrated Circuit Development System, the contents of both applications are incorporated by reference herein.

TECHNICAL FIELD

This disclosure relates to an integrated circuit development system, and, more particularly, to an integrated circuit development system including hardware objects, a communication fabric facilitating messages between hardware objects, and a system that allows software representation and execution of systems on the hardware objects.

BACKGROUND

Integrated circuit (IC) design and development is presently a very difficult and expensive process. An ever-widening design gap is appearing as the stringent constraints of today's ASIC (Application Specific Integrated Circuit) methodologies and EDA (Electronic Design Automation) tools are causing designers to fail at effectively using all the extra gates that each new fabrication technology offers.

Full custom design has become extremely expensive, even when those designs result in massively regular structures, such as cache memory, because the exponentially increasing complexity in the low-level details of each new fabrication technology do not allow much new design in the available time. IC speeds are being limited by present day architectures, which have an ever increasing need for long wires and more and more interconnections between chip components. This increased amount of interconnection is causing a new manufacturing paradigm where defects in the wiring dominate.

As fabrication technology continues to advance to transistor densities near one billion transistors on a single die, it is becoming apparent that the steeply rising design costs, exponentially increasing verification effort, inherent limitations of present day design tools, and the inability to effectively re-use what has gone before will make future development extremely expensive and only available to few.

Illustrated in FIGS. 1A and 1B is an example process to create an IC using ASICs and FPGAs (Field Programmable Gate Array). The design begins by creating a system model, illustrated here as interconnected functions As, Bs, and Cs. The system model can be modeled in any manner; such a modeling system includes, for example, a block diagram, a Unified Modeling Language (UML) model or a data flow graph. Once the system model is finished, a software description is created by hand, which is both time-consuming and is difficult to check. The software description may be created in, for example, C, C++, Java, Matlab, Smalltalk or System C.

Next the software description is hand translated in to a Register Transfer Level (RTL) description that can be used to create a logic gate model of the system. RTL is a generic term for Hardware Description Languages (HDL), such as Verilog or VHDL, which can be used to generate the logic gate model through synthesis. RTL is used to create both ASIC (FIG. 1A) or FPGA (FIG. 1B) solutions. Again, translating from the software description to RTL by hand is both time-consuming and difficult to check. For an ASIC, once synthesis has created the logic gate model, more software is used to place and route the functional gates, using semi-automated hardware layout tools. Once laid out, the generated patterns are optimized to account for optical effects in the manufacturing process. It should be noted that there are many iterations needed to optimize the process, and some of the optimizations are manually performed. Finally, a mask set is created and used to make the particular designed ASIC.

With reference to FIG. 1B, similar processes occur for creating an FPGA. Again an RTL description and synthesis is used to develop the logic gate model. Several iterations may be required to ensure the design physically fits onto the target part. Once the mapping is known, the design is tested to ensure the timing requirements are met. If the timing design requirements are not initially met, the structure of the RTL must be altered until both the mapping and the timing requirements are satisfied. For example, it is quite often necessary to have multiple repetitions of the same logic which run in parallel to ensure the timing constraints can be met; this can only be accomplished by altering the RTL description. Finally, the logic mapping for every element on the FPGA is loaded into a ROM. When the FPGA device is powered on, all the FPGA elements are automatically loaded from the ROM to create the desired function.

Because of the shrinking size of transistors and other IC components, full-custom design will require many more designers than are used at the present, which adds huge complexity and requires exponentially more time and resources to develop compared to the present state of the art. In an attempt to reduce the hardware complexity and reduce the verification risk of making a mistake in the hardware, many systems are now using a mixture of hardware and software. In this new paradigm, performance is traded-off against using software running on programmable hardware for many of the components so that functionality and bugs can be fixed after the device has been manufactured. This co-design process, where software and hardware co-exist to create the solution, is a problem that has been explored extensively in the last twenty years with little success.

Extensive re-use of hardware and software components, essential to ensuring that large, complex designs can be executed and verified within a reasonable time, has proven to be unachievable and has only been managed in a limited sense within small, tightly-knit design centers.

Embodiments of the invention address these and other limitations in the prior art.

BRIEF DESCRIPTION OF THE DRAWINGS

FIG. 1A is a block diagram illustrating typical processes used to design ASICs.

FIG. 1B is a block diagram illustrating typical processes used to design FPGAs.

FIG. 11 illustrates how two data packets can be combined.

FIG. 12 is a block diagram showing how a traditional FIFO element can be integrated into the invention.

FIG. 13 is a block diagram showing how a hardware object can be constructed using protocol registers.

FIG. 26 is a block diagram illustrating an object library used in conjunction with a re-configurable chip for developing systems.

FIG. 27 is a block diagram illustrating software object hierarchy.

FIG. 28 is a block diagram illustrating a software model of a hardware system.

FIGS. 32, 33, 34, and 35 are diagrams illustrating an example system that can be created using embodiments of the invention.

DETAILED DESCRIPTION

Embodiments of the invention include a system for an integrated circuit development. Elements of the development system include hardware and software objects. These objects can be instanced, ordered, parameterized, and connected in a software environment to implement different functions. Once in software, the description defines the topology and properties of a set of objects. These objects are hierarchically composed from other objects. The lowest level in the hierarchy is denoted a primitive object. By using a piece of hardware that can both implement the function and maintain the essential properties of a software object, the topology and properties of the software description is all that is required to define a piece of hardware that can perform the desired functions. Using embodiments of the invention, circuit designers can design hardware systems with little or no knowledge of hardware or hardware design, requiring only the software description.

Communication Fundamentals

Fundamentally, hardware objects formed on an IC communicate with one another using electrical signals. States of electrical signals are defined to represent data. For instance, an electrical signal having a voltage value above a mid-point between an operating voltage and a ground reference voltage can be considered to represent a "1" or HIGH value, while voltages below the mid-point voltage can be considered to be a "0" or LOW value. To ensure signal integrity, only a limited voltage range near the ground reference is considered to be a LOW value. Similarly only a limited voltage range near the operating voltage is considered a HIGH value. Any voltage in between the limits is an undefined logic state.

In all discussions and figures, a HIGH value indicates that the signal is asserted; a LOW value is a de-asserted value. The active sense of any signal is not determined by the terms HIGH or LOW.

Multiple signals can be transferred between objects along a parallel data bus, which allows data to be transmitted simultaneously from a first point to a second point. The amount of data able to be transferred within a particular time is determined by the data width of the bus and the frequency at which the data state is updated.

Oftentimes, data transmission protocols are used to govern when and how data is transferred between objects. The protocols are typically not themselves part of the actual "data" transmission, but rather indicate qualities about the data or synchronize the transmission of the data. For example, a receiving object may indicate when it is busy and cannot receive data.

Figure 2:
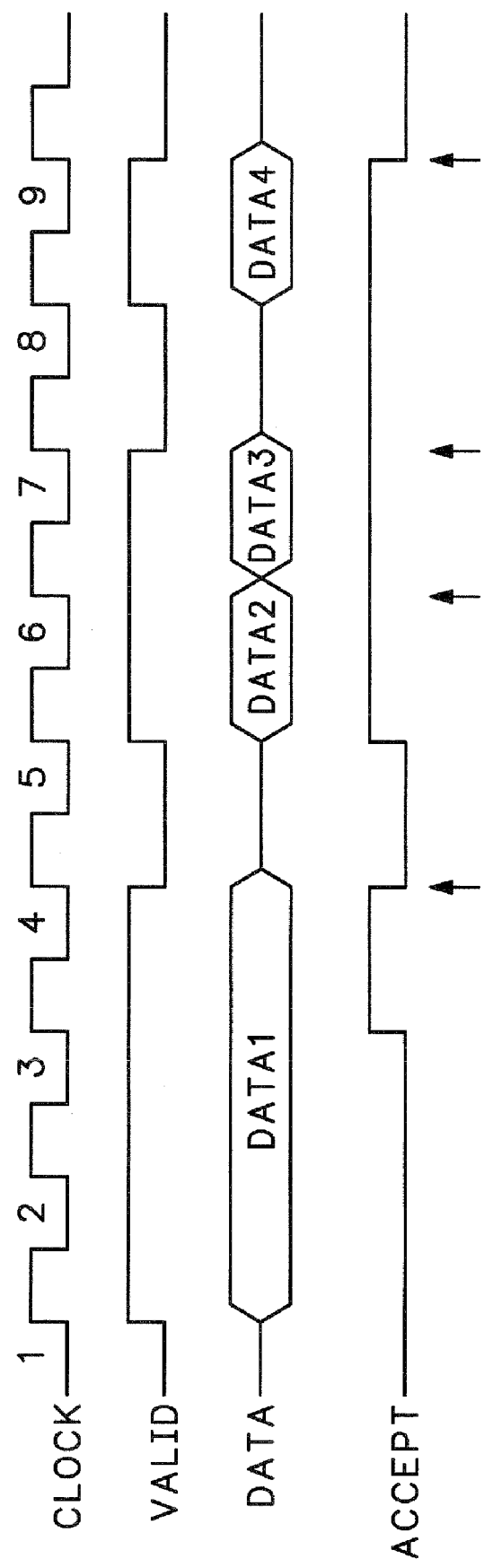
FIG. 2 is a timing diagram illustrating a data transfer protocol.

FIG. 2 is a timing diagram illustrating a relatively straight-forward data transfer protocol in which the receiving object indicates its availability to receive data by asserting an "accept" signal. Similarly, a sending object indicates whether the data it is sending is valid or invalid. Invalid data may take any value and is never used.

Referring to FIG. 2, a HIGH accept signal indicates that the receiving object can receive data. A HIGH valid signal indicates that the data has a useful value. When the accept and valid signals are both HIGH, a data transfer occurs between a sending object and a receiving object. A clock signal is shown in FIG. 2. The clock triggers the valid, accept, and data signals on its positive edge. The data signals may be a single bit, or may include several bits of data simultaneously sent. Common data bus widths are powers of two, such as 8, 16, 32 or 64.

In the first clock pulse, the positive edge of the clock signal illustrated in FIG. 2, the valid bit is driven HIGH, indicating that the data signals are a meaningful value. The accept signal is LOW, however, which indicates that the receiving object is not ready to receive the data. The data signals maintain the value DATA1 until clock edge 4, when the accept signal is HIGH. The accept signal was driven HIGH on clock edge 3, indicating that the receiving object is ready to receive. At clock edge 4, data DATA1 is transferred from the sending object to the receiving object. An arrow indicates the transfer of data. On clock edges 6, 7, and 9 a transfer occurs because both the valid and accept signals are HIGH. On all other clock edges no transfer occurs because one or both of valid and accept are LOW. The clock is illustrated in FIG. 2 to facilitate discussion by showing transitions on clock edges. The transfer protocol shown in FIG. 2 is one of the pre-emptive class of protocols where the receiving object indicates readiness to receive with no a priori knowledge of the state of the sending object.

Figure 3:
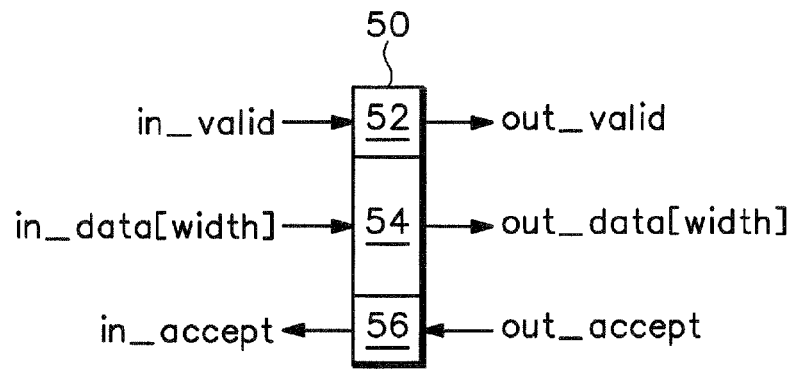
FIG. 3 is a block diagram illustrating an abstract view of a protocol register.

FIG. 3 is a block diagram illustrating a protocol register 50. The register is a set of storage elements between an input interface and an output interface. The interfaces in FIG. 3 use the same protocol as detailed in FIG. 2. The input interface uses the in_accept signal to indicate that the storage elements 52 and 54 can be updated. If in_accept is HIGH, storage elements 54 store the value on in_data, and storage elements 52 store the value on in_valid. Note that storage elements 52 and 54 may hold one or more (valid,data) value pairs. The output interface presents the oldest value of storage elements 52 on out_valid and the oldest value of storage elements 54 on out_data. The values on out_valid and out_data are changed to the next eldest (valid,data) value pair when the signal out_accept is HIGH, otherwise they do not change The storage elements 56 contain the history of the out_accept signal and are used to calculate the next value of signal in_accept.

Figure 4:
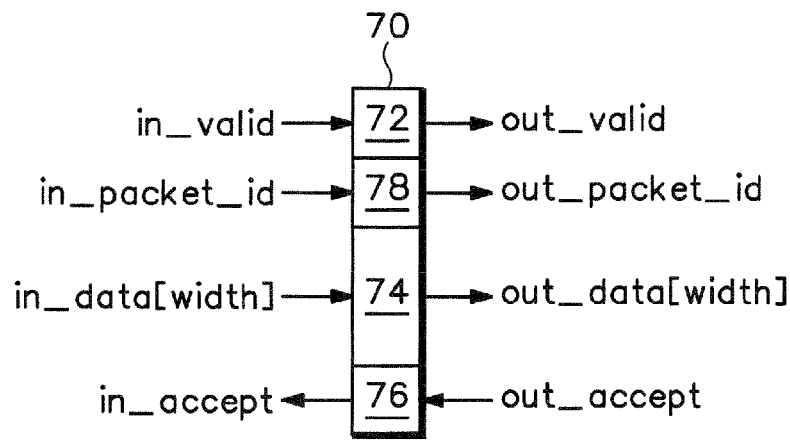
FIG. 4 is a block diagram illustrating another abstract view of a protocol register according to embodiments of the invention.

FIG. 4 is a block diagram of another protocol data register 70, which includes storage elements 72, 74, 76, and 78. The storage elements 72, 74, and 76 correspond to the storage elements 52, 54, and 56 of the protocol register 50 of FIG. 3, which operates similarly. Discussion of these elements is omitted for brevity. The storage element 78 extends the register 70 to also store a history of packet_identifier values. Register 50 of FIG. 3 stored a history of (valid,data) pairs; the register 70 of FIG. 4 stores a history of (valid,(data,packet_id)) triples. In each triple, a HIGH valid value indicates whether the (data,packet_id) pair value is meaningful. If the valid value is LOW the (data,packet_id) pair cannot be used, or an undefined result may occur. The (data packet_id) is a pair where the packet_id value indicates the position of the data value within a larger group of data, or data packet. Oftentimes packet messages will contain more data than can be simultaneously transferred in parallel, and the message will be broken up into several "words" of data. The terminology "message packet" and "word" as used here is to be interpreted in its broadest sense, and does not connote any particular structure, format, or limitations. Therefore, multiple sets of data, or words, may need to be sent to transfer a single message packet.

In one embodiment, the packet_id value is a single bit, but could, of course, be any indication of the data's membership in a larger group, or message packet. In a particular embodiment, a LOW value of the packet_id indicates that it is the last word in a message packet. All other words would have a HIGH value for packet_id. Using this indication, the first word in a message packet can be determined by detecting a HIGH packet_id value that immediately follows a LOW value for the word that precedes the current word. Alternatively stated, the first HIGH value for the packet_id that follows a LOW value for a preceding packet_id indicates the first word in a message packet. Only the first and last word can be determined if using a single bit packet_id.

Figure 5:
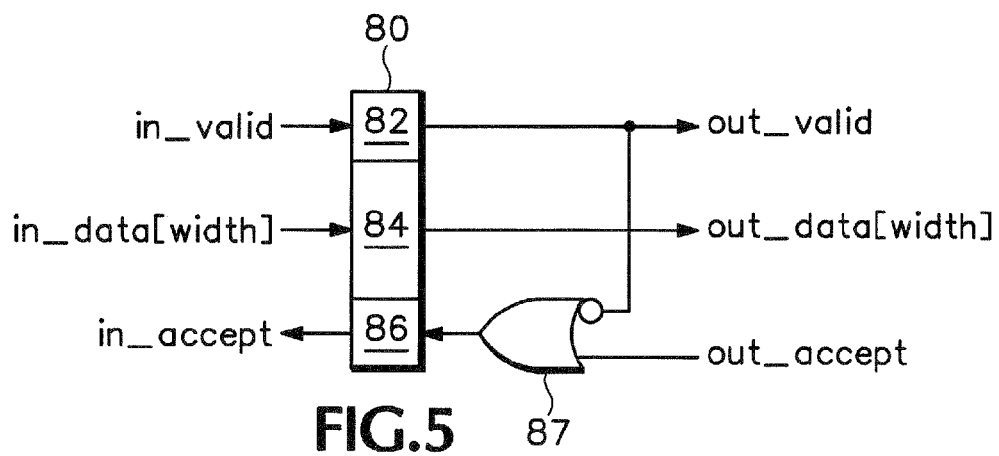
FIG. 5 is a block diagram of a protocol register that includes combinational logic.

FIG. 5 illustrates a protocol register 80 that includes combinational logic. The protocol register 80 of FIG. 5 is similar to the protocol register 50 of FIG. 3, in which storage elements 82, 84, and 86 correspond to storage elements 52, 54, and 56, but includes logic 87 on the output interface. In the embodiment illustrated in FIG. 5, the logic 87 is a two-input OR gate. The logic 87 combines the negated $out_{13}$ valid signal from the register 82 with the $out_{13}$ accept signal to ensure that, even if $out_{13}$ valid is LOW, the protocol register 80 always updates to the next eldest (valid,data) pair. Practical uses for such behavior is illustrated in detail below.

FIGS. 6A-6E are block diagrams illustrating a behavior of a series of protocol registers 80, assembled into a pipeline 90. The pipeline 90 includes nine registers, labeled R1-R9. Each FIG. 6A-6E illustrates a different time period, t1-t5. The pipeline 90 uses the out_accept signal from the next receiving object (not shown). The next receiving object, as described above, drives the out_accept signal LOW when it is unable to receive data. The out_accept signal in the sequence t1-t5 is always LOW, indicating that the receiving object is not receiving during t1-t5. With reference back to FIG. 5, the storage location 86 computes an in_accept signal, and sends it back to the next register. For example, the in_accept signal of register R1 is the out_accept signal of register R2 and so on. In this manner, the out_accept signal from the receiving object is sequentially sent down the pipeline 90.

Figure 6A:
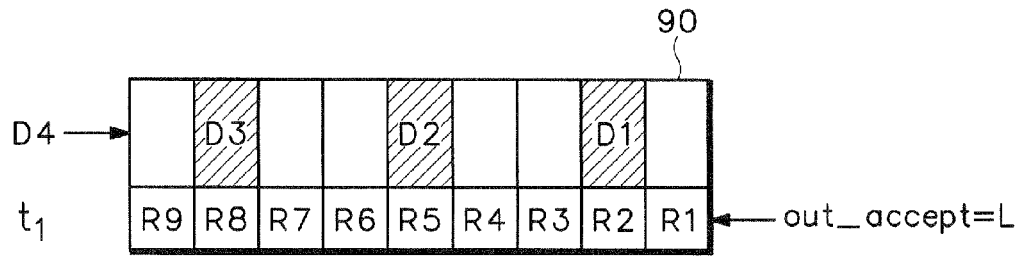
FIGS. 6A, 6B, 6C, 6D, and 6E are block diagrams illustrating a behavior of a data pipeline formed of a series of protocol registers.
Figure 6B:
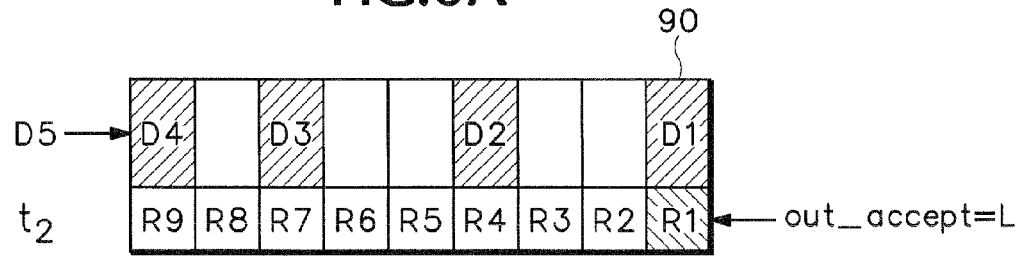
Figure 6C:
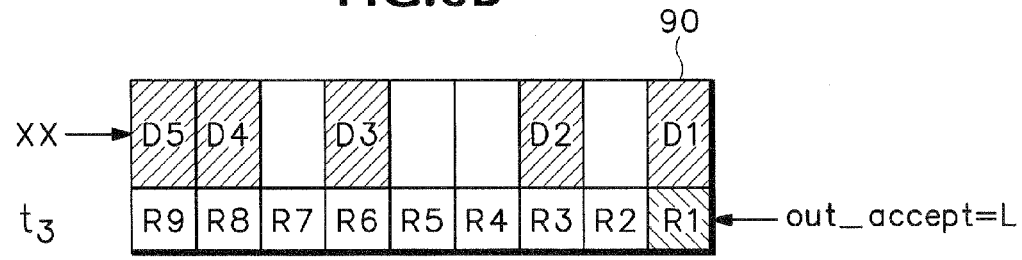
Figure 6D:
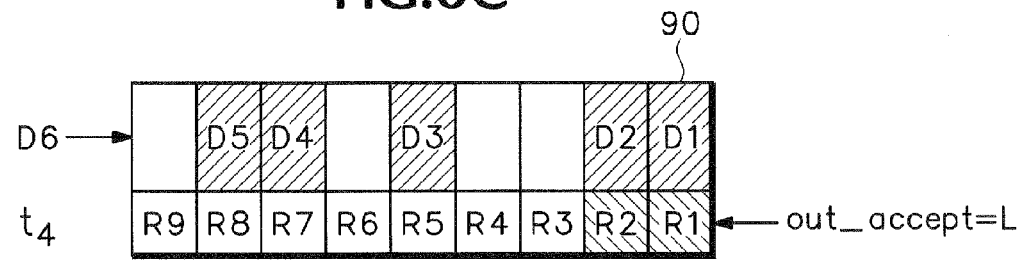
Figure 6E:
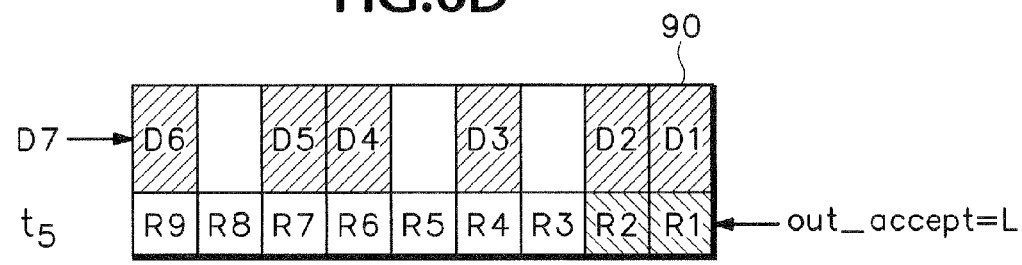

With reference to FIG. 6A, at time t1 the pipeline 90 holds three valid words of data, D1, D2, and D3. The pipeline 90 holds other data that is considered invalid. Valid data is illustrated as shaded boxes in the individual registers, while invalid data is illustrated as unshaded boxes. As described above, in each cycle, the pipeline 90 uses an out_accept signal from the next receiving object. The pipeline 90 also accepts another (valid,data) pair from the sending object (not shown). In FIG. 6A (time t1), a fourth valid word of data D4 is being sent to the pipeline 90.

Therefore, at time t1, there are three words of valid data D1, D2, D3, all stored in separate protocol registers R2, R5 and R8 of the pipeline 90. In each cycle that the intermediate out_accept signal is HIGH, the (valid,data) pairs progress to the next register. In cycle t1, logic 87 of FIG. 5 allows register R1 to be updated even though out_accept presented to R1 is LOW. In cycles t2 and t3, the intermediate out_accept for R2 remains HIGH because R2 contains invalid data. The effect of logic 87 of FIG. 5 is to remove any invalid data words in the pipeline 90 and to ensure that each register R1-R9 in the pipeline 90 only stops processing if it is storing meaningful data.

The action of logic 87 is repeated between all registers R1-R9 and allows all of the invalid data between D1 and D2 to be removed by cycle t4, and all of the invalid data between D1 and D3 would be removed by cycle t6 (not shown). Note that this invalid data was removed even though the $out_{13}$ accept signal presented to R1 was held LOW, indicating that the receiving object was not accepting data. In what would otherwise be wasted cycles, embodiments of the invention allows the pipeline to continue usefully processing data.

Figure 7:
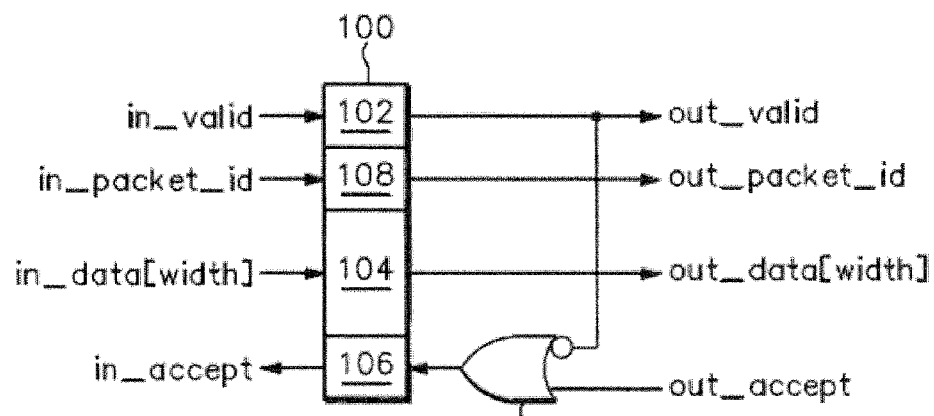
FIG. 7 is a block diagram of another protocol register according to embodiments of the invention.

FIG. 7 is a block diagram of a protocol register 100 that combines aspects of the protocol register 70 (FIG. 4) with the logic 87 of FIG. 5. The protocol register 100 includes storage locations 102, 104, 106, and 108 to store the respective signals as described with reference to FIG. 4. A logic element 107 includes an OR function that corresponds to logic 87 of FIG. 5. Of course, the logic element 107 can be formed of any combination of gates that provide the same functionality.

Figure 8:
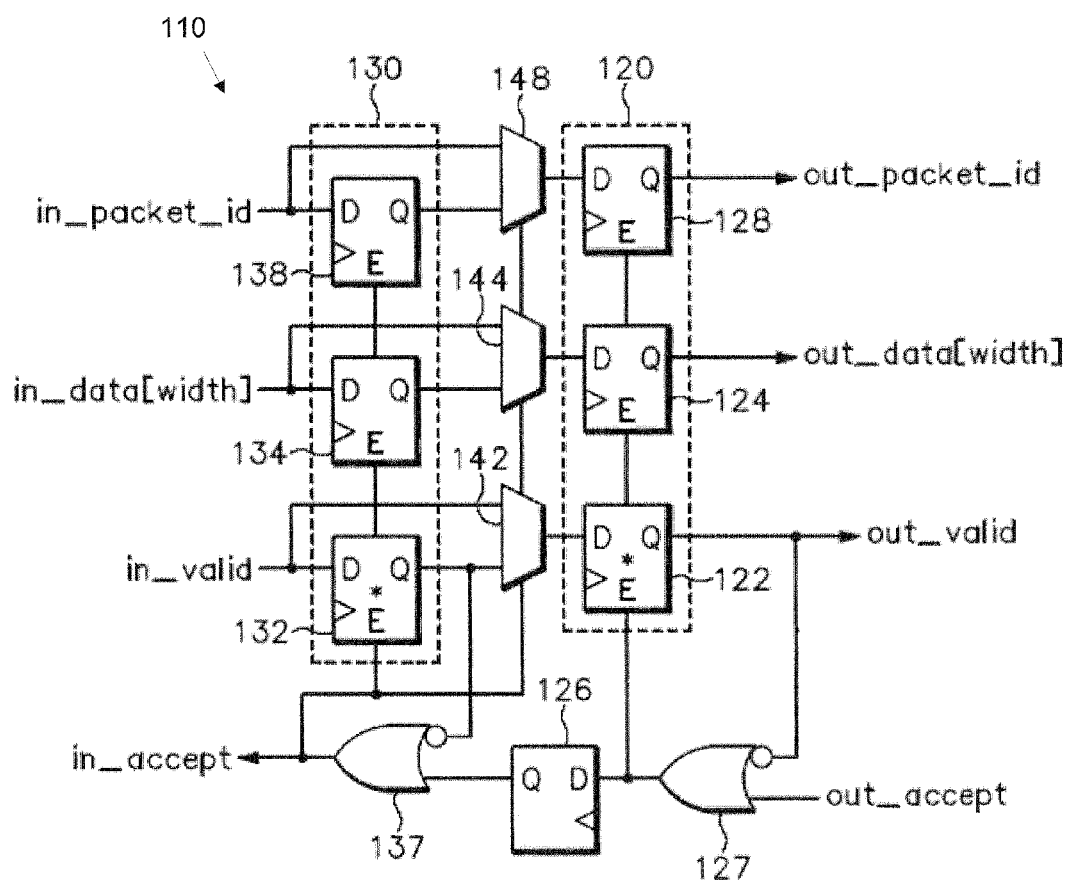
FIG. 8 is a schematic diagram of a protocol register according to embodiments of the invention.

FIG. 8 is a schematic diagram illustrating an implementation of a protocol register 110 with a single history, according to embodiments of the invention. The protocol register 110 of FIG. 8 includes storage registers illustrated as edge-triggered clocked, "D" type flip flops. Additionally, some of the flip-flops include an enable input, which only allows the input value to transferred to the output on a positive clock edge when the enable is HIGH. The description here uses a master synchronous clock (not shown) to explain the operation, but the circuit can be adapted to run using asynchronous clocks as illustrated in a below example.

The D-type flip-flops 132, 134 and 138 form a first register set capable of storing one (valid,data,packet_id) value triple. This register set is denoted the "side register" 130. The D-type flip-flops 122, 124 and 128 form a second register set capable of storing another (valid,data,packet_id) value triple. This register set is denoted the "main register" 120. The multiplexers 142, 144 and 148 form a logic set that allows the main register 120 to be loaded with either a (valid,data,packet_id) triple from the input (if signal in_accept is HIGH), or from the side register 130 if signal in_accept is LOW.

As stated previously, the width of the data value can be any number of bits.

Logic functions 127 and 137 correspond to the logic 87 of FIG. 5 and the detailed function is not described here. The register 126 creates a copy of out_accept delayed by one cycle that becomes in_accept (ignoring the action of logic functions 127 and 137).

The side register 130 is loaded with the input triple when in_accept is HIGH, otherwise the side register retains the previous value triple. The combination of the multiplexers 142, 144 and 148 and in_accept and out_accept control the action of the main register 120. Table 1 shows the operation of the main register.

TABLE 1

| out_accept | in_accept | Main Register 120 | Description | Protocol Register 110 |
|---|---|---|---|---|
| LOW | LOW | No input | Both registers 120 and 130 are full | STOPPED |
| LOW | HIGH | No Input | Main register 120 is full and side register 130 is being updated | STOPPING |
| HIGH | LOW | Updated from side register 130 | Data from side register 130 moves to main register 120 | STARTING |
| HIGH | HIGH | Updated from main input | Input and output interface are directly connected through main register 120 | NORMAL |

Figure 9:
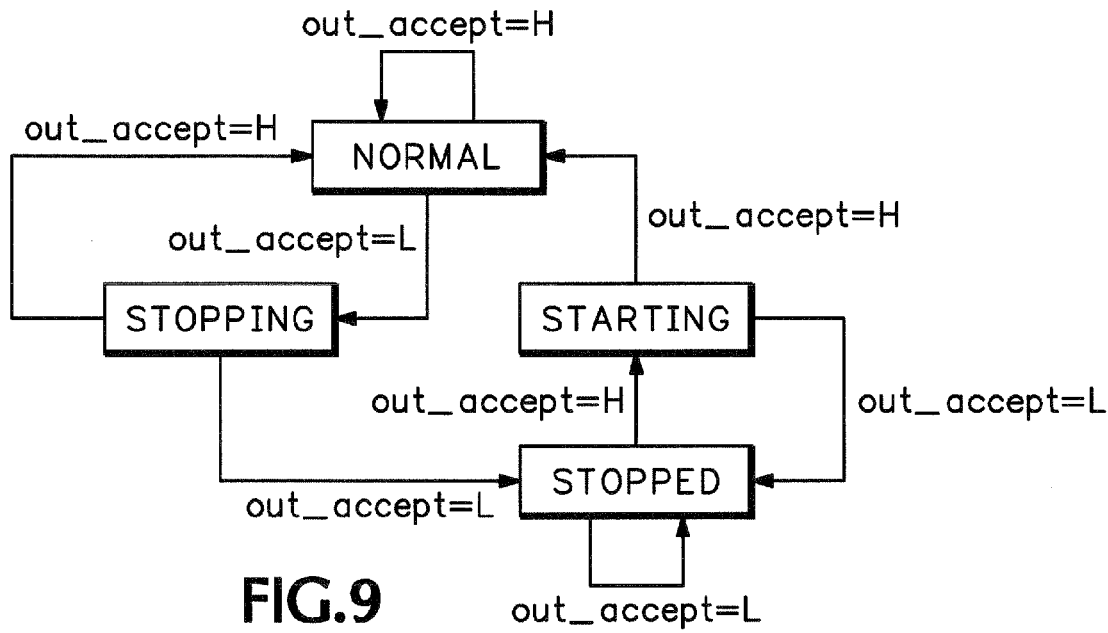
FIG. 9 is a state transition diagram for the protocol register of FIG. 8.

Table 1 shows that there are four states for the protocol register 110: NORMAL, STOPPING, STOPPED and STARTING. The NORMAL state is when the register is operating normally—transferring the next value triple from the input interface directly to the output interface. The STOPPING state occurs when the output interface out_accept signal goes LOW, indicating that the receiving object cannot receive data, and the input interface in_accept signal has not yet gone LOW. During the STOPPING state, a new input value triple may be accepted—this is stored in the side register 130. The STOPPED state is when both input and output interfaces do not transfer any data and both registers 120 and 130 are full of valid data. The STARTING state, is when the output interface transfers the oldest value triple, but the input interface has stopped. In the STARTING state the next eldest value triple, held in the side register 130, is transferred to the main register 120. The state transition diagram for the protocol register 10 is given in FIG. 9, showing the states and the transitions of the out_accept signal that causes each state to change.

Figure 10:
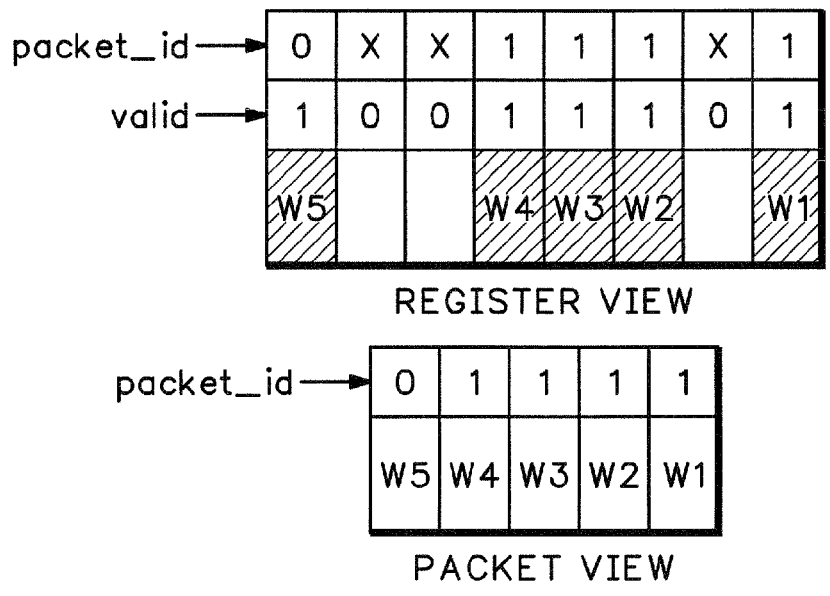
FIG. 10 illustrates two block diagrams of a data packet showing invalid data members.

FIG. 10 shows two possible views of a combination of (valid,data,packet_id) value triples that makes up a packet of length 5. Each value triple is labeled as a word, W1-W5. The register view shows that the packet consists of both valid and invalid value triples, with the shaded boxes showing the valid case. When the valid is LOW, the packet_id signal is undefined, as are the data signals. The packet_id signal is a single bit signal where LOW indicates the last word in the packet. As described above, a transition of packet_id from LOW to HIGH determines the first word in a packet.

The packet view of FIG. 10 has abstracted the valid signal state by only drawing valid words. This is the most convenient view of a multi-word packet.

FIG. 11 shows how two equal length packets, in this case each of length 5 words, can be combined word-by-word. In a packet view of FIG. 10 the action is very simple: each word is combined separately to make a new packet of length 5. The cycle-by-cycle behavior is more complex, and the register view of FIG. 11 illustrates how the valid signal in each packet affects the actual operation.

FIG. 11 uses two packets, A and B, each having 5 words and labeled consecutively as A1-A5 and B1-B5, respectively. In the example of FIG. 11, the combination results in a new packet of length 5, each output word being A1+B1, A2+B2, . . . , A5+B5.

FIG. 11 shows the operation during each cycle from T1 to T10. On cycle T1, both input words A1 and B1 are accepted and the sum A1+B1 output. The output (valid,data,packet_id) value triple in cycle T1 is (1,A1+B1,1). In cycle T2, no addition can take place because B2 is not valid, so A2 waits for B2 until cycle T5 when both A2 and B2 are present and can be added to create the output value triple (1,A2+B2,1). In cycles T2, T3 and T4 the output value triple is (0,X,X), where X is any undefined value, because there was no valid output. In cycle T6, A3 and B3 are available and the output value triple is (1,A3+B3,1). In cycle T7, B4 is on the input, but must wait for the A4, creating the invalid output value triple (0,X, X). In cycle T8, A4 and B4 are combined to create the output value triple (1,A4+B4,1). In cycle T9, B5 is on the input, but must wait for A5, creating the invalid output value triple (0,X,X). In cycle T10, both A5 and B5 can be accepted to create the final word (1,A5+B5,0).

In FIG. 11, the packet_id field can be a copy of either the packet A word packet_id field, or copied from the packet B word. The situation is symmetric because the packets must be of equal length in this example. FIG. 11 shows how the invalid words are not destroyed, but re-arranged in the output packet according to the relative position of the invalid words in the incoming packets. The time period required to combine the packets is always at least as long as the longest packet.

FIG. 12 shows how a traditionally designed First-In First-Out (FIFO) element 147 can be transformed into the protocol register 50 of FIG. 3. A traditional FIFO element 147 can be synchronous, using a master clock, or asynchronous where the input interface and output interface are separately clocked using independent, unrelated clocks. The traditional FIFO element 147 uses a push signal to push input data into the FIFO. The FIFO generates a full signal when the FIFO is full. The behavior of asserting the push signal when full is HIGH is undefined because some implementations discard the input data and some simply ignore the push signal under these conditions. Similarly, the traditional FIFO element 147 uses a pop signal to output data from the FIFO. An empty signal is provided when the FIFO is empty. Similar to the push/full problem, asserting the pop signal when the empty signal is HIGH is undefined, because sonic implementations output undefined values while others ignore the pop signal under these conditions.

FIG. 12 shows how the FIFO element 147 is transformed into the protocol register 50 of FIG. 3 by adding logic functions 140, 141, 143 and 145. The in_data and out_data signals correspond exactly to the FIFO element 147 input and output data ports. The inverter 140 ensures that out_valid is HIGH if the FIFO is not empty, i.e. there is data in the FIFO element 147. The inverter 145 ensures that in_accept is HIGH if the FIFO is not full, i.e. there is still space available in the FIFO element 147. The two-input AND logic functions 141 and 143 ensure that any possible undefined behaviors of the FIFO element 147 are precluded by removing the illegal states push=HIGH while FIFO element 147 is full and pop=HIGH while the FIFO element 147 is empty.

FIG. 13 illustrates how the protocol register 50 of FIG. 3 or other of the example protocol registers described above, or combinations of the same, are used to create hardware objects. The top example in FIG. 13 shows a simple pipeline stage, where there is one input port and one port to the hardware object 150. The hardware object 150 communicates to the rest of the system using messages which can be constructed using the packet binding described in FIG. 10. The content and structure of the message is not dictated by the packet binding in FIG. 10, and any form of message and content is easily constructed, including, but not limited to, data, operands, results, commands, instructions, routing directions, message status flags and internal structure identifiers.

All messages are treated asynchronously. For the input port, asynchronous means being able to receive a message at any time—the only action if the input message cannot be processed by the hardware object 150 is to block the input. This is achieved by the protocol register 155 driving its in_accept signal LOW if any part of a message cannot be consumed or processed. For the output port, asynchronous means being able to output a message only when ready to do so—the only action if the output message is not ready is for the hardware object 150 to output nothing. This is achieved by the protocol register 156 driving its out_valid signal LOW.

Having asynchronous messages controlling the actions of hardware object 150 is useful to create hardware objects that directly correspond to the behaviors and properties of a software object. The circuitry 151 inside the hardware object 150 can be any combination of circuits because the protocol registers 155 and 156 isolate the circuitry 151 from any surrounding circuitry and thus having unanticipated side-effects. Further, using asynchronous messages removes any timing issues created externally since messages can be received and output at any time.

Included in FIG. 13 is an alternative implementation of the hardware object 150. The relationship between hardware object 152 and hardware object 150 will be described below, but it is important to note that protocol register 157 and 158 can correspond directly to protocol registers 155 and 156 respectively. Further, circuitry 153 may be identical to circuitry 151. Hardware object 152 contains a simple FIFO 154 and an extra protocol register 159. The action of FIFO 154 and protocol register 159 is to buffer and delay any input messages. In a synchronous system, this delay would result in a change of latency in operation of hardware object 152 when compared to hardware object 150, but would have no effect on throughput or function. In an asynchronous system there is no strict notion of time and latency, and so hardware object 152 and hardware object 150 have identical behaviors.

The internal protocol register 159 in FIG. 13 shows that protocol registers can have useful functions within a hardware object, and not just at the boundaries. The preferred embodiments of the invention use protocol registers exclusively whenever it is beneficial to use such a register.

Figure 14:
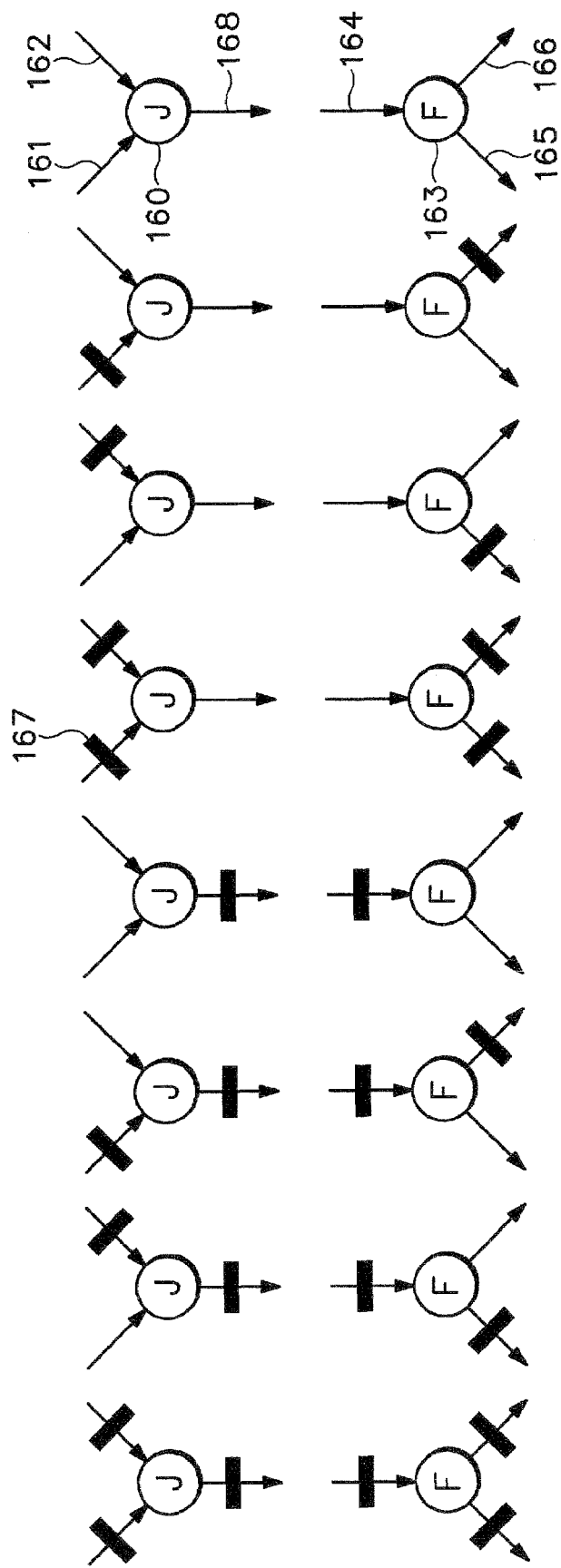
FIG. 14 is a schematic diagram showing equivalent combinations of fork, join and protocol registers.

FIG. 14 shows a simple join and simple fork function, each with different combinations of protocol registers.

The join function 160 operates on whole messages which correspond to the packet binding of FIG. 10. A message is described in detail in the description of FIG. 13. A join function 160 in its simplest form has two input ports 161 and 162, one output port 168 and synchronizes messages received on the two input ports 161 and 162. The synchronization is performed by only starting the output message when both input ports 161 and 162 have the first word of a message, and by only completing when both input interfaces 161 and 162 have received the last word of the messages that started the synchronization process.

The fork function 163 operates on whole messages which correspond to the packet binding of FIG. 10. A message is described in detail in the description of FIG. 13. A fork function 163 in its simplest form has two output ports 165 and 166, one input port 164 and duplicates an input message received on the input port 164 to both the output ports 165 and 166. The duplicating process is performed by only starting the output message when the input port 164 has the first word of a message, and by only completing when both output interfaces 165 and 166 have sent the last word of the message that started the process.

A protocol register 50 of FIG. 3 is shown on FIG. 14 as a filled rectangle. As an example, rectangle 167 represents a protocol register. FIG. 14 shows all equivalent topologies that create the same fork and join functions—in effect placing the protocol registers does not change the function. As explained in detail in the description of FIG. 13, inserting protocol registers in an asynchronous system does not affect timing or function.

The different topologies in FIG. 14 show that the decision to insert a protocol register can be made arbitrarily. In preferred embodiments of the invention, the registers are placed on an IC so as to make every protocol register have approximately equal electrical loading and thus similar timing characteristics. By enforcing this rule, every protocol register operates essentially identically. If hardware objects are constructed using protocol registers as ports as shown in FIG. 13, the input and output ports of the hardware object will have identical function and electrical performance, independent of which protocol registers on the IC were selected to implement the hardware object. This allows hardware objects to be re-locatable or re-instanced with no side effects, an important feature for hardware modeling a software object whose instances are assumed to behave identically at any time in any place.

Figure 15:
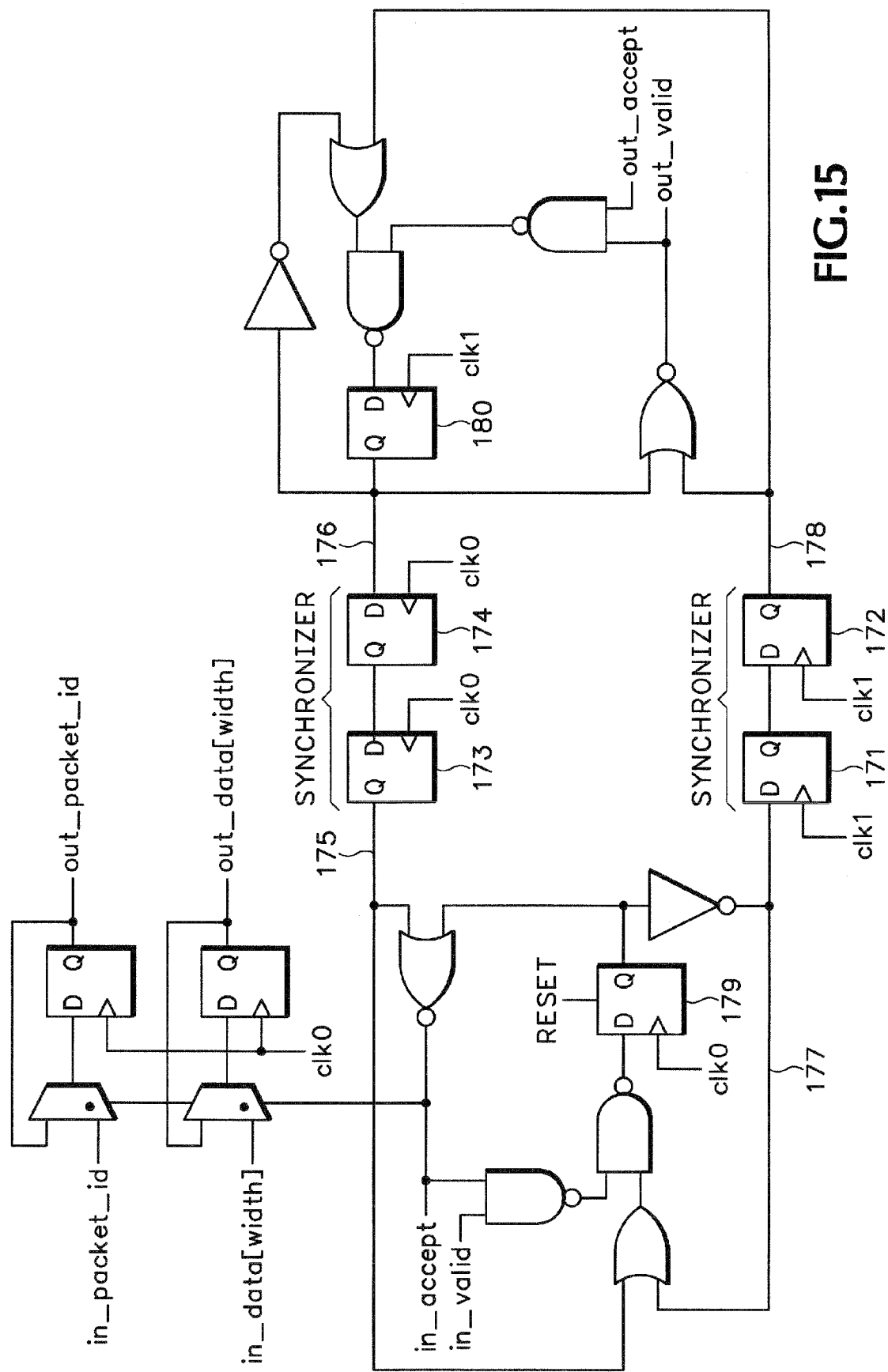
FIG. 15 is a schematic diagram showing an asynchronous implementation of a protocol register.

FIG. 15 shows how the protocol register implementation 110 in FIG. 8 can be extended to create a protocol register that uses asynchronous clocks, clk1 and clk2, for the input and output interfaces respectively without repeating or losing a (valid,data,packet_id) value triple. The D-type flip-flops 171, 172, 173 and 174 perform a synchronization function whereby a transition into the synchronizer could create a meta-stable input voltage and the action of the synchronizer is to (randomly) resolve that meta-stable voltage into a valid HIGH or LOW voltage. The resolution of the synchronizers can be random because the original transition will remain stable over at least two cycles and so the true logic value will always be sampled correctly on the next cycle after the meta-stable event. In many systems more than two D-type flip-flops (171, 172 or 173, 174) can be cascaded to reduce the probability of a meta-stable output voltage, or particular synchronizer elements can be used in place of the D-type flip-flop 171, 172, 173 and 174.

FIG. 15 shows that the valid and accept signals are explicitly synchronized. The in_data and in_packet_id signals are sampled synchronously and the action of the logic in FIG. 15 ensures that the out_data and out_packet_id signals do not change when out_valid and out_accept are HIGH and a transfer is made to the receiving protocol register (not shown).

The valid and accept logic of FIG. 15 creates a latch, whereby a logic HIGH value is passed through one of the synchronizers and cannot be reset LOW until the corresponding HIGH value in the other synchronizer is received.

In the reset state, the critical nodes 175 and 176 are LOW and 177 and 178 are HIGH. This is the quiescent state of the circuit. In the quiescent state, the primary outputs out_valid is LOW and in_accept is HIGH, that is the register is empty and ready to start. Having out_valid=LOW means that the state of out_accept is irrelevant in the quiescent state. The next state can only occur when in_valid goes HIGH, thus inputting a (valid,data,packet_id) value triple. A state register 179 ensures that node 177 will go LOW along with in_accept on the next cycle. This ensures that no more input data can be accepted. The LOW value of node 177 is synchronized using flip-flops 171 and 172, eventually resulting in a LOW on node 178. With both nodes 176 and 178 LOW, out_valid is driven HIGH. A state register 180 records the time when a transfer occurs, that is, when out_valid and out_accept are both HIGH. State register 180 ensures that node 176 will go HIGH on the next cycle following a transfer. Having node 176 HIGH forces out_valid LOW so that the transfer of data is not repeated. The HIGH value on node 176 is synchronized using flip-flops 173 and 174, eventually resulting in a HIGH value on node 175.

The state where the critical nodes 175 and 176 are HIGH and 177 and 178 are LOW is a rest state where a transfer has completed. In the rest state, having node 175 HIGH starts a chain of events whereby node 177, 178, 176 and 175 eventually all return their respective quiescent states of LOW, LOW, HIGH and HIGH. At this point a new transfer can be started when in_valid goes HIGH.

Figure 16:
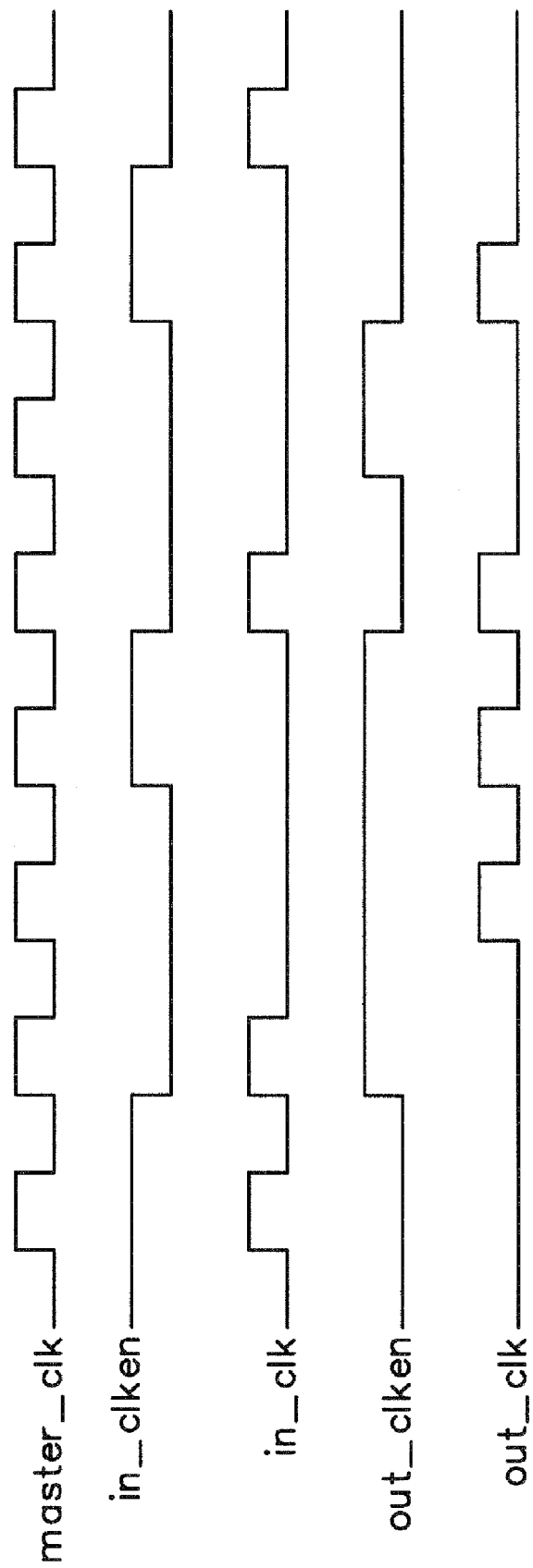
FIG. 16 is a timing diagram showing pseudo-asynchronous clock generation.

FIG. 16 is a timing diagram showing how different clock frequencies can be constructed from a master clock. In FIG. 16 two "asynchronous" frequencies are generated, in_clk and out_clk. The frequencies are always lower than master_clk, and do not necessarily have the same mark-space or even coincident clock edges. In FIG. 16, there are 4 positive clock edges on each of in_clk and out_clk for every 15 positive clock edges of master_clk (if the sequence is assumed to repeat). This means that the frequency of both in_clk and out_clk are both 4/15 the frequency of the master_clk, but the different placement of the edges between in_clk and out_clk indicate that both clocks are effectively asynchronous to each other.

FIG. 16 shows that clocks that are essentially asynchronous can relatively easily be created from a master synchronous clock, and further, with arbitrary frequency division ratios for each output clock. In FIG. 16 the in_clken is an enable signal (synchronous to master_clk) that is sampled on the negative edge of master_clk and then used as a mask for an AND function with master_clk to create the in_clk. Similarly the out_clken is an enable signal (synchronous to master_clk) that is sampled on the negative edge of master_clk and then used as a mask for an AND function with master_clk to create the out_clk. The clocking schema described in FIG. 16 is known as pseudo-asynchronous clocking.

Figure 17:
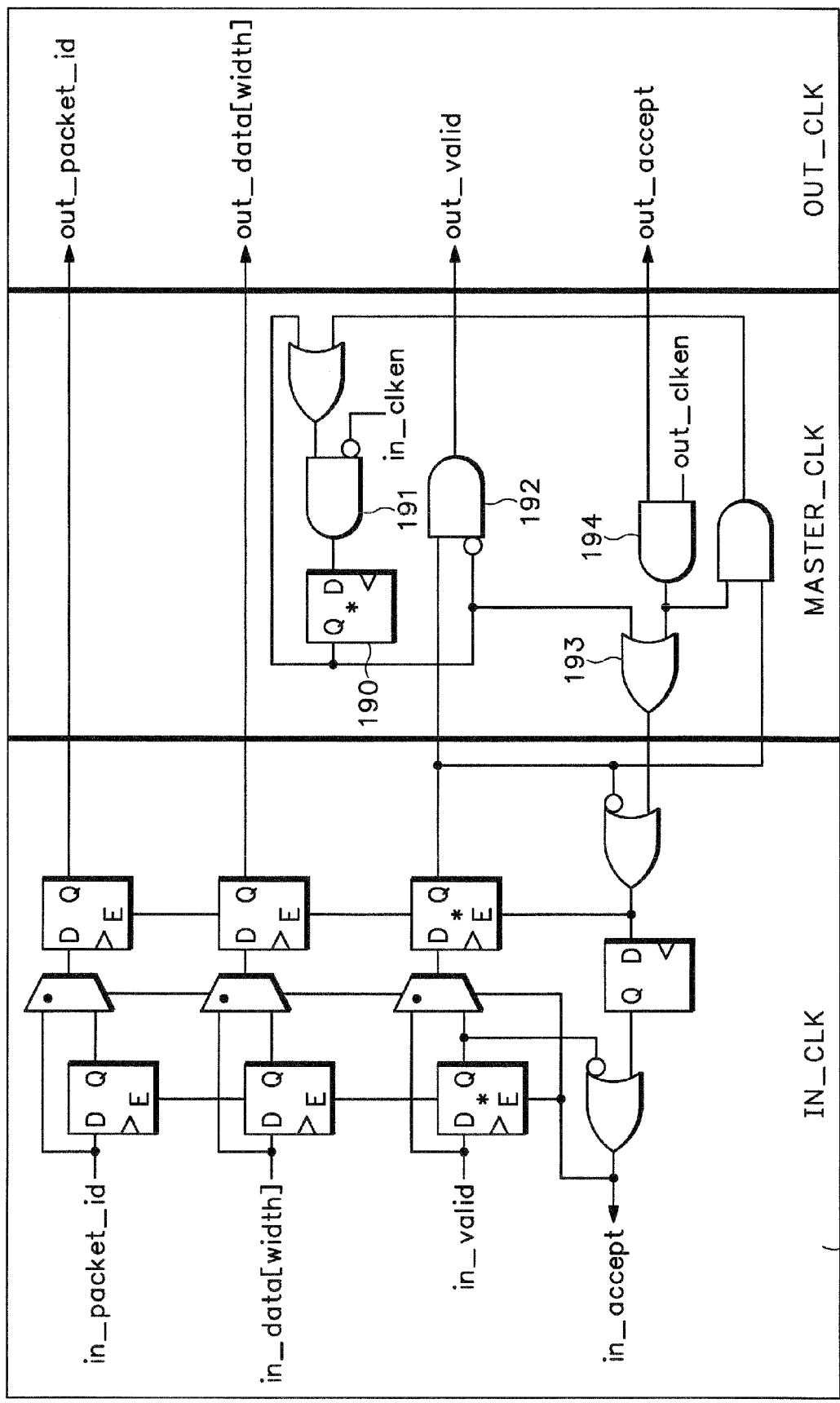
FIG. 17 is a block diagram showing a pseudo-asynchronous implementation of a protocol register.

FIG. 17 shows how the protocol register implementation 110 in FIG. 8 can be extended to create a protocol register that uses a pseudo-asynchronous IN_CLK and OUT_CLK for the input and output interfaces respectively without repeating or losing a (valid,data,packet_id) value triple. The pseudo-asynchronous IN_CLK and OUT_CLK are generated from a MASTER_CLK, in_clken and out_clken as described in FIG. 16. The logic of FIG. 8 is replicated in the region denoted IN_CLK and creates a protocol register 196. All D-type flip-flops in the IN_CLK region are clocked using IN_CLK. The additional logic in the middle region denoted by MASTER_CLK serves to ensure that the protocol is re-formatted so that the output interface shown in the region denoted by OUT_CLK is correctly formed and aligned to the OUT_CLK signal. The D-type flip-flop 190 is clocked using the MASTER_CLK signal.

The logic in the MASTER_CLK region of FIG. 17 is arranged in a manner to ensure that the operation is identical to the implementation in FIG. 8 if IN_CLK and OUT_CLK are identical, even at the fastest rate where in_clken and out_clken are HIGH permanently. In this case the operation of the logic is clear. Logic gate 191 always outputs a LOW value, as does the D-type flip-flop 190. Logic gates 192, 193 and 194 are therefore in the pass mode and the state of out_accept and out_valid are directly controlled by the protocol register 196.

For the other ease where the in_clken and out_clken are not permanently HIGH in FIG. 17, the gates in the MASTER_CLK region are controlled so that the $out_{13}$ valid and the output of logic gate 193 (which is the out_accept for the protocol register 196 clocked by IN_CLK) are in the correct state: logic gate 192 removes the possibility of duplicating out_valid when the next in_clken has not yet been asserted by driving out_valid LOW, and logic gate 193 ensures that the "$out_{13}$ accept" is extended (and not missed) until the next assertion of in_clken by driving the output of gate 193 HIGH.

Hardware Objects

Figure 18:
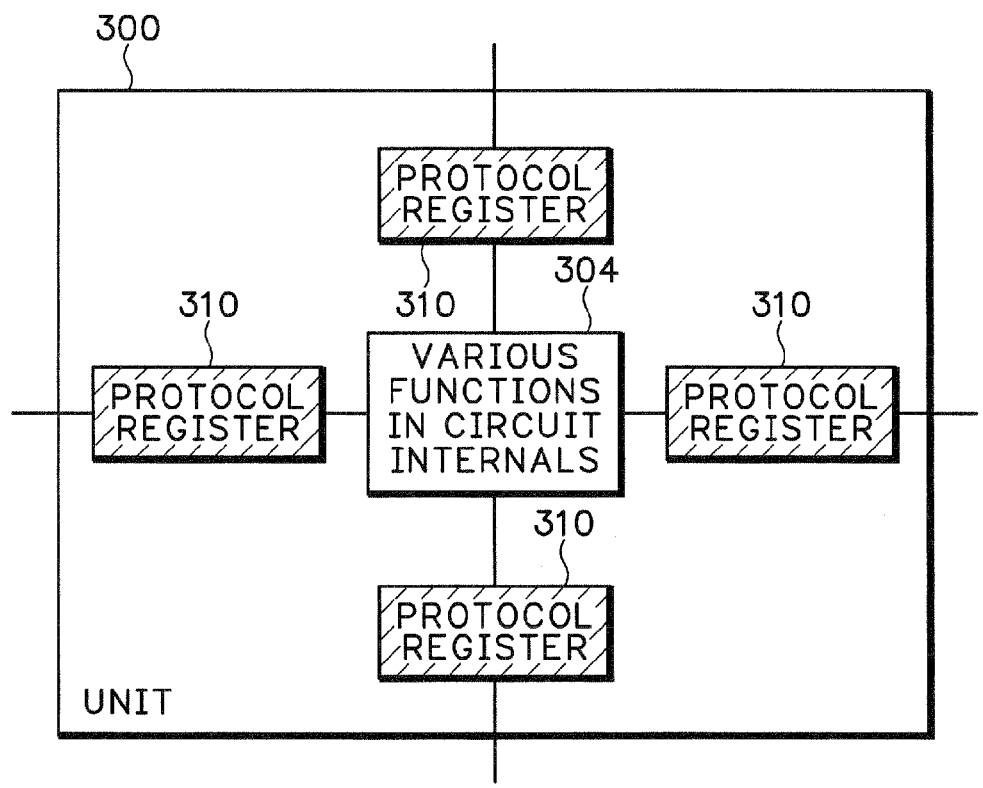
FIG. 18 is a block diagram of an example hardware object.

FIG. 18 illustrates a functional diagram of a hardware object. As described above, hardware objects include circuitry bounded by a number of protocol registers. The protocol registers can be the same registers as described above. The presence of registers does not affect the logic flow of the circuitry at all, but rather are used to balance electrical loading by segmenting long signal wires. Each hardware object is completely encapsulated and is not affected by the state of any other object. The hardware objects communicate with one another by sending messages or message packets. The packets can contain instructions or data, or both. In some embodiments, an internal state of a hardware object may only be interrogated or altered by using messages. Once a hardware object receives instructions and appropriate data, the receiving hardware object can operate on the data to produce output. The output can then be sent to another object.

In the described development system, hardware objects are generally medium-grained, i.e., not the most simple function, such as an AND gate, but also not an overly complex function, which would tend to destroy the universal nature of the collection of hardware objects. Some examples of medium-grained objects include IO structures, micro-processors, RAM, and Finite State Machines (FSM). Some objects are extremely general purpose; others have a fixed functionality. Objects can have sub-functionality that can be inherited, for example a Multiply Accumulate (MAC) object can act as an adder or a multiplier in some applications.

A hardware object 300 includes a set of particularized central circuitry 304, which is typically "bounded" by at least one input protocol register 310 and an output protocol register 310. In FIG. 18, multiple protocol registers 310 are present. In practice, because the existence and/or placement of protocol registers 310 does not affect circuit operation, it is possible to have a hardware object that has no protocol registers without destroying the object's function or ability to operate. Conversely, a hardware object 300 may include dozens of registers, both inside the central circuitry 304 and at the boundary. The ability to place a protocol register 310 anywhere can be used to eliminate long signal wires to be formed within a chip by choosing physical locations that balance resistive and capacitive loading. The protocol registers 310 may differ from one another somewhat, in that some registers may be minimal while other registers may have additional features or capabilities. Typically, protocol registers would be differentiated by the number of data signals they can simultaneously transfer. Example systems may include several types of protocol registers of varying types.

Figure 19:
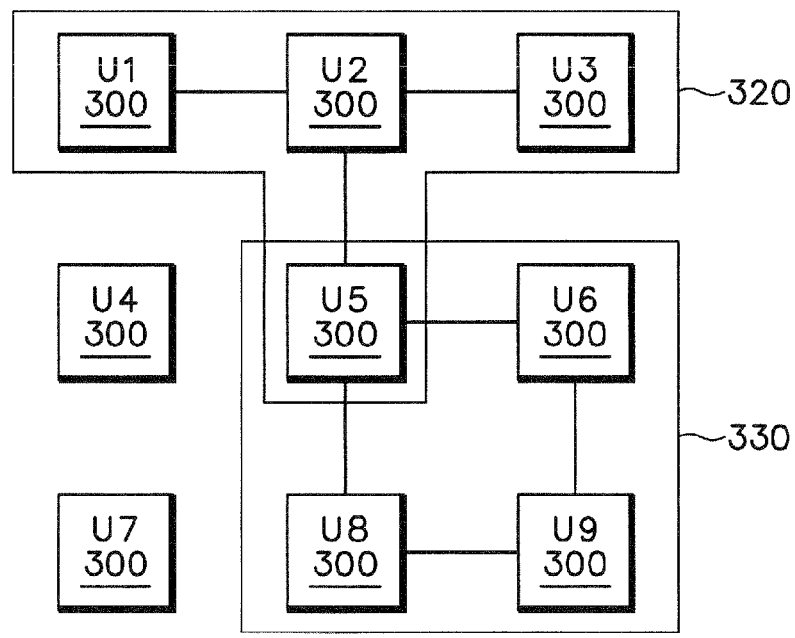
FIG. 19 is a block diagram illustrating how hardware objects can be defined from existing hardware objects.

Hardware objects 300 may stand alone, but it is much more useful to associate several hardware objects together. FIG. 19 illustrates nine hardware objects 300, labeled U1-U9. Two of the hardware objects 300, U4 and U7, are independent and not associated in this example with a hardware object. Multiple hardware objects 300 can be associated to create other hardware objects having more functionality than is capable, or preferred, by individual hardware objects alone. As illustrated in FIG. 19, hardware objects U1, U2, U3 and U5 are associated with one another to create a hardware object 320. The hardware object 320 could have been simply formed as a specific stand-alone circuit, with internal communication between its component pieces. However, using embodiments of the invention, individual hardware objects do not lose their generality simply because they are associated with other components. On the contrary, building more powerful hardware objects from collections of smaller hardware objects is a distinct advantage of using the inventive concepts contained herein.

FIG. 19 also illustrates another hardware object 330 formed by associating the hardware objects U5, U6, U8, and U9. From a functional standpoint, it does not matter that U5 is a member of both hardware objects 320 and 330. In some cases the shared functionality comes from having hardware object U5 comprised of separable hardware and each of the component functions of hardware object 320 and hardware object 330 operating on independent hardware. In another case, the component functions of hardware object 320 and hardware object 330 run on shared hardware within hardware object U5. Time-sharing functionality must be present in hardware object 320 and hardware object 330 to ensure that the hardware can be shared with any appropriate priority or performance criteria.

Figure 20A:
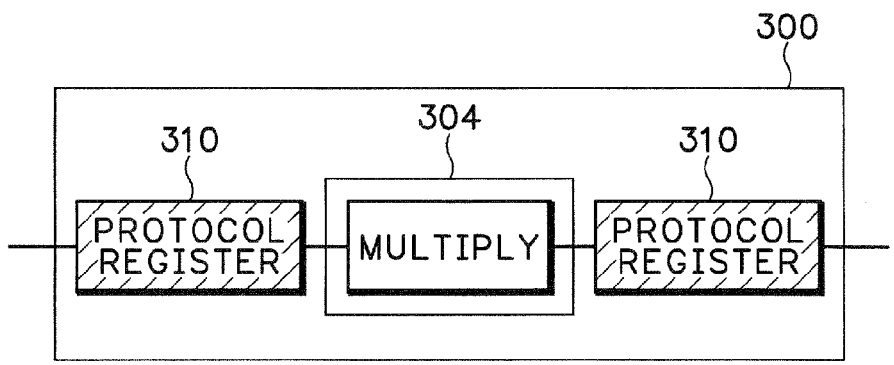
FIGS. 20A, 20B, and 20C are block diagrams illustrating different types of hardware objects.
Figure 20B:
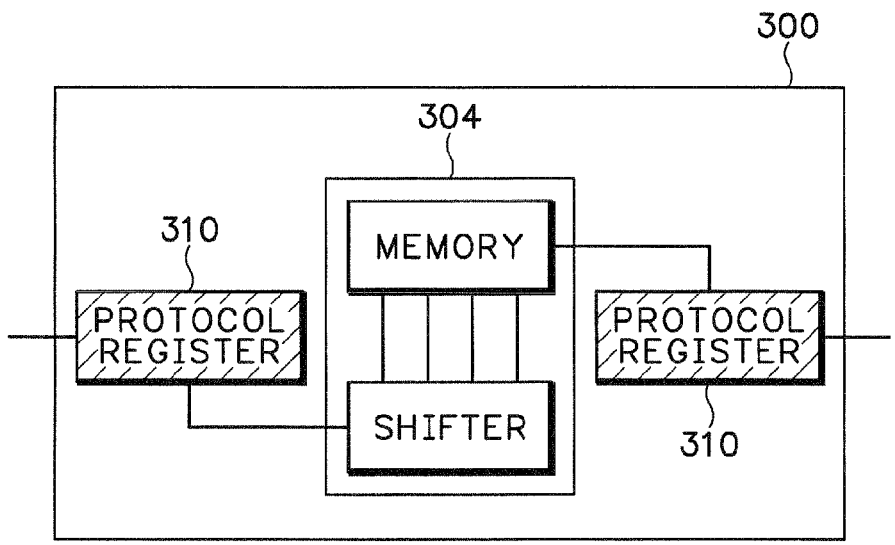
Figure 20C:
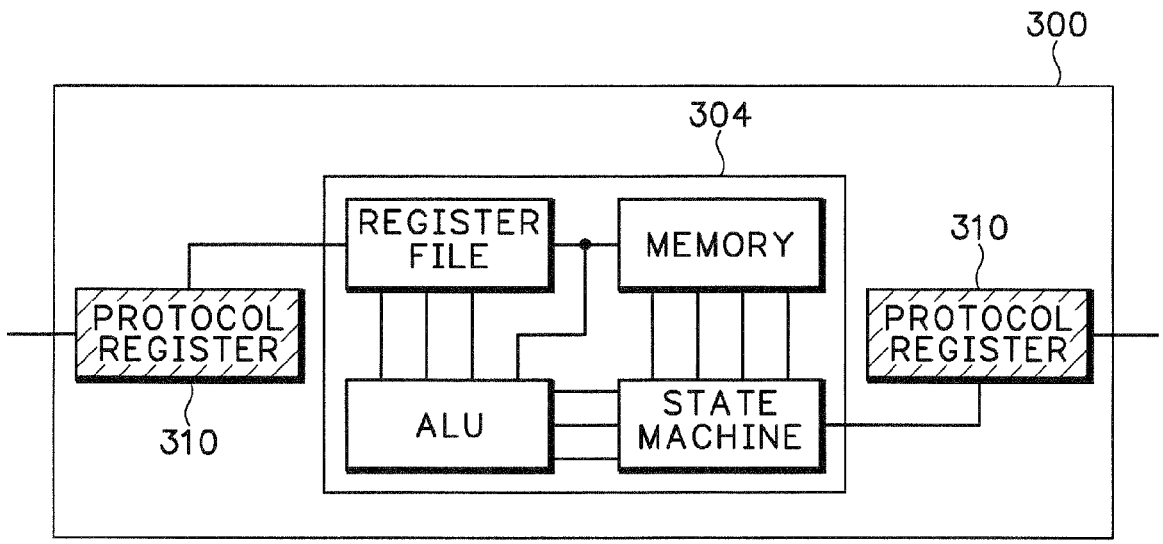

FIGS. 20A-20C illustrate example hardware objects 300, each of which has a different central circuitry 304. FIG. 20A illustrates a hardware object 300 that includes a multiply function in its central circuitry 304. The multiply function may be implemented by a hardware multiplier or by other methods as is well known in the art. The protocol registers 310 provide a uniform data interface between the hardware object 300 and other objects. FIG. 20B illustrates a hardware object 300 that includes a memory and a shifter in its central circuitry 304. In this example, the memory and shifter communicate with one another directly, without passing through a protocol register 310. Communication within the central circuitry 304 may use internal protocol registers 310 in addition to protocol registers used at the boundaries of the hardware objects. Or other forms of communication can be used within the central circuitry 304. For instance, as illustrated in FIG. 20B, the memory and shifter may communicate directly to one another using a direct bus protocol. Additionally, the memory and shifter could communicate through a serial line, if desired. For purposes of assembling hardware objects and developing systems that can be implemented, it is relatively unimportant how components within the central circuitry 304 of any hardware object 300 communicate with one another. The hardware object 300 of FIG. 20B also includes protocol registers 310, to facilitate communication between objects.

FIG. 20C illustrates an additional example of a hardware object 300 having yet other components in the central circuitry 304. In this example, a memory and state machine are additionally coupled to a register file and an Arithmetic Logic Unit (ALU). This example illustrates that not all components of the central circuitry 304 need to communicate with one another directly, and that communication using any methods or protocols can be integrated within the particular hardware objects 300 themselves. In almost all cases, however, including protocol registers 310 at the "edges" of the central circuitry 304 facilitates easy aggregation of hardware objects to create very powerful and complex objects.

Figure 21:
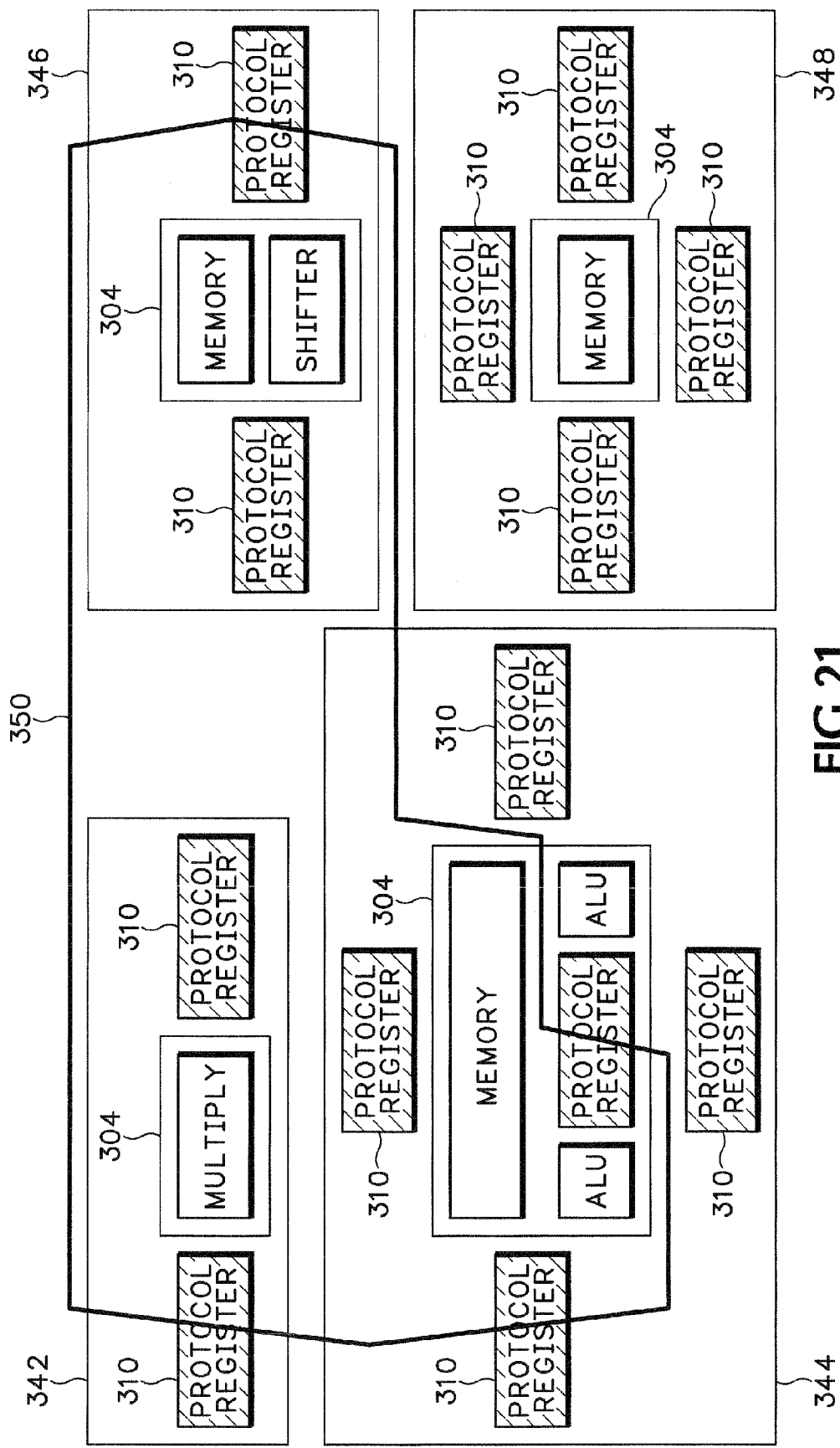
FIG. 21 is a block diagram illustrating another type of hardware object.

FIG. 21 illustrates that hardware objects do not have to be bounded by the same boundaries as other hardware objects. In FIG. 21, five hardware objects are illustrated. Four hardware objects fixed on the IC substrate are 342, 344, 346, and 348. An object 350 is made from elements of the objects 342, 344, and 346. The object 350 includes the complete objects 342 and 346, but only includes a portion of the object 344. Specifically, the object 350 uses the memory and only one of the ALUs of the central circuitry 304 of the hardware object 344. Note that the object 350 is still bounded by protocol registers 310, because the central circuitry 304 of the hardware object 344 already utilized them internally. In this instance, the object 350 can use the protocol register 310 that was inside the central circuitry 304 of the hardware object 344. The remaining ALU from object 344 and the whole of object 348 are unallocated here, but can be used to form another hardware object.

Figure 22:
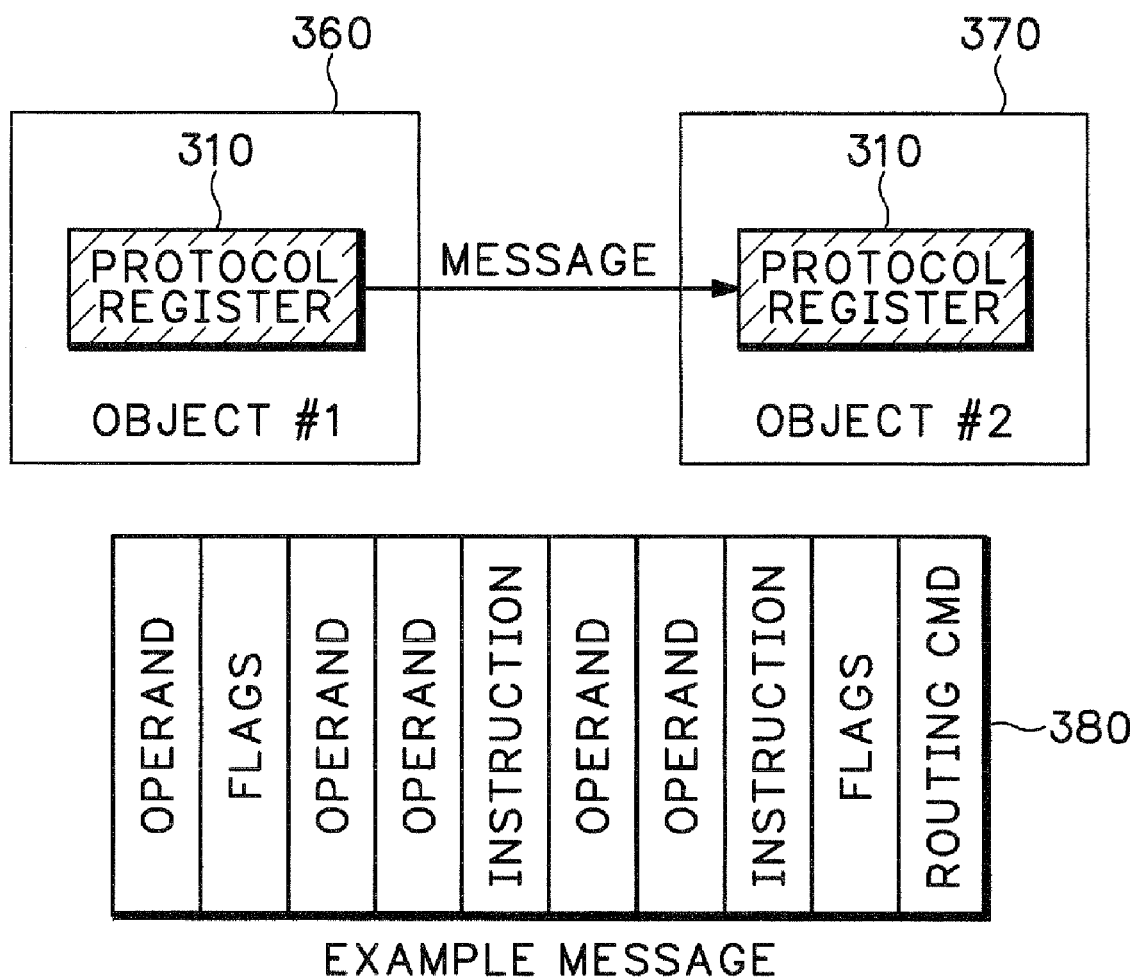
FIG. 22 is a block diagram illustrating how hardware objects can communicate with one another using messages.

Objects communicate to one another by sending asynchronous messages, which can be implemented using message packets in preferred embodiments of the invention, to one another. The message packets do not restrict the content or structure of the message, which may include data, instructions, addresses, and/or information about the message packets themselves. FIG. 22 illustrates two hardware objects 360, 370 that communicate with one another using messages between their respective protocol registers 310. Embodiments of the invention do not dictate any particular message format or require that messages adhere to any certain protocol. Of course, as a system is being designed an understanding between the sender and receiver of message structure must be formed so that the sender and the receiver can interpret the messages correctly.

An example message 380, containing 10 words, is also illustrated in FIG. 22. This example message 380 begins with a routing command, which could be a destination address or a fixed command such as "ROUTE LEFT". When a system of hardware objects is linked and fixed on a re-configurable chip, as described below, each hardware object on the IC substrate may be assigned a unique address. Messages can be directed based on the unique address, or based on steering commands, for example. After the routing information, the message 380 includes flags that can be used to identify the type of information contained in the message or even the higher-level structure of the message. Because messages according to the protocol sent over the protocol registers 310 can represent several different types, flags can be used to indicate which types are used. The flags may indicate the format of the message, for example containing data only, containing instructions, etc. The example message 380 of FIG. 22 further includes a series of instructions and operands and various flags that will be used by the receiving object 370. In some instances, the receiving object may simply pass some or all of the instructions and operands received from a sending object to another object. Pass-through messages are used where a first object sends a message to another object that is not directly connected to the first object.

Figure 23:
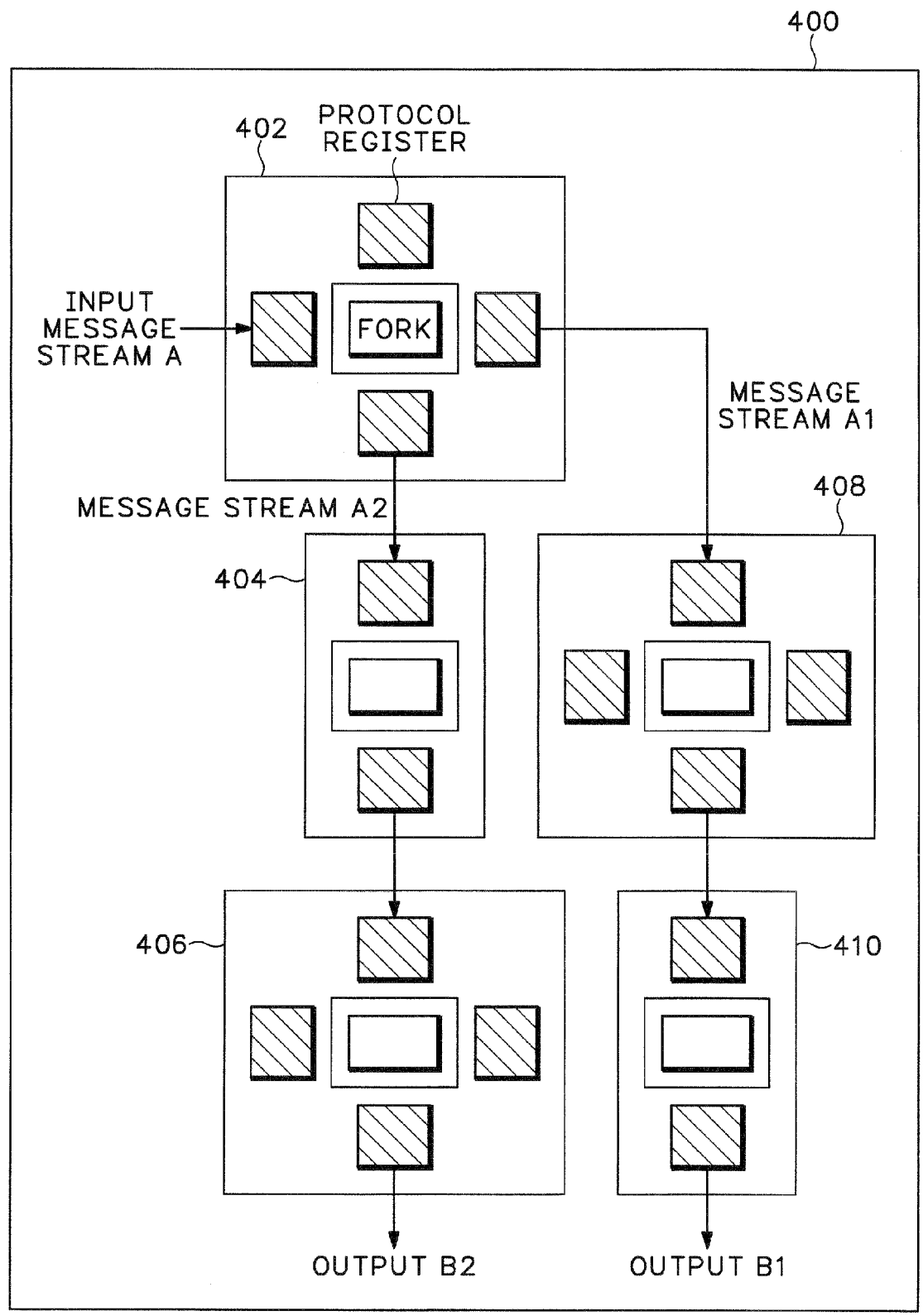
FIG. 23 is a block diagram illustrating a messaging fork object.

FIG. 23 illustrates a "messaging fork" object 400, which includes a number of elementary objects 402, 404, 406, 408, and 410. A single data-stream A is input to the object 400, and two outputs, A1 and A2, are generated. The fork can operate on any data or operands included in the data-stream A. Within the fork primitive object 402, the message stream A is split into two component streams A1 and A2. In its most basic form, the fork object 402 simply duplicates data from the data-stream A to make two streams A1 and A2. In other embodiments, the fork object 402 can perform operations on the incoming stream before parsing it into component streams. For instance, the fork object 402 may accept a mixed number stream in the data-stream A and split only integers into stream A1 and floating point numbers into stream A2. Other embodiments of fork objects 400 can simply split streams without operating on them, for example all addressed messages within a specified range can go into output stream A2 and all other messages into output stream A1. In this manner, a large volume of incoming data can be split across a number of separate parallel processes. Other types of forks include steering forks which steer packets in a fixed direction unless a routing command in the message packet is encountered, at which point the steering fork obeys the routing command. Although illustrated as only creating two resultant data streams A1, and A2, multiple fork objects can be linked to generate any number of resultant streams.

FIG. 23 also shows that objects 404 and 406 can operate on the message stream A2 to create very complex fork functionalities. Similarly, objects 408 and 410 can operate on message stream A1 to create further functionalities. The importance of the structure of object 400, being formed of the five objects 402, 404, 406, 408 and 410, is that the message streams A1 and A2 are operated upon in parallel. For example, if one of the streams is temporarily blocked, the other stream continues processing.

FIG. 23 does not limit the length of any of the streams: in particular it could be essential to make output streams B1 and B2 different lengths even though they were both invoked by an input message of the same length in this example.

Figure 24:
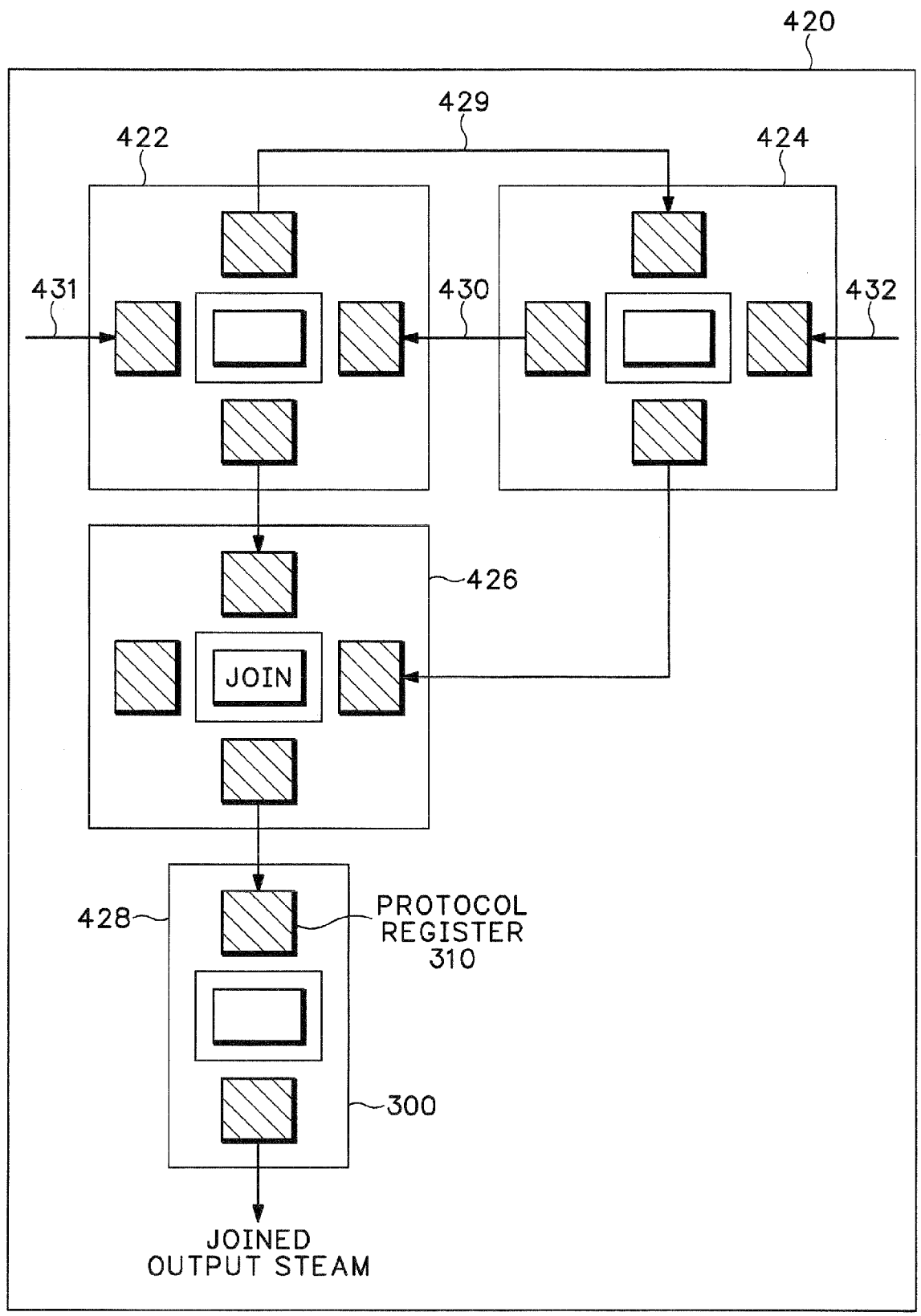
FIG. 24 is a block diagram illustrating a messaging join object.

FIG. 24 illustrates a "joining" object 420, which accepts two input streams and joins them as a unitary stream. Similar to the fork object described in FIG. 23, the join object 420 can take almost any form necessary to implement a desired function. A common join function is synchronizing on the two input messages. In this case both input messages must be present before any output stream starts to generate, and once started, the synchronization process cannot complete until the entirety of each input message has been received. Another common function is the "alternate join" function, which copies the first input message to arrive to the output. Once an input message is accepted, another message on the other input waits for the copy to complete. Generally the "alternate join" function arbitrates fairly according to a least-recently-used policy, but other variants that have fixed input priority or act on priority encoded in the input messages are commonly used. The join function, and its analog the fork function, is extremely useful in an asynchronous compute system because the function can be used to create a computation order between the outputs of parallel processes.

FIG. 24 shows that complex joining functions can be created by combining hardware objects together. The feedback terms 429 and 430 between objects 422 and 424 allows very complex combinations of input message streams 431 and 432 to be implemented. Similarly object 428 can be used to post-process the output of the basic join object 426, making the final join object 420 very much more complex than the internal basic join object 426. Similar to FIG. 23, the essential quality of the join object 420 is that its component pieces operate independently.

Having hardware objects that are easily combined, operate independently and communicate using asynchronous messages as described in FIGS. 21, 23 and 24 is not necessarily enough to guarantee maximum system performance. Further, using one of the variant protocol registers as described above ensures that every component object within a system will continue to process data until it is completely stopped (when it cannot output and is full of valid data).

Figure 25:
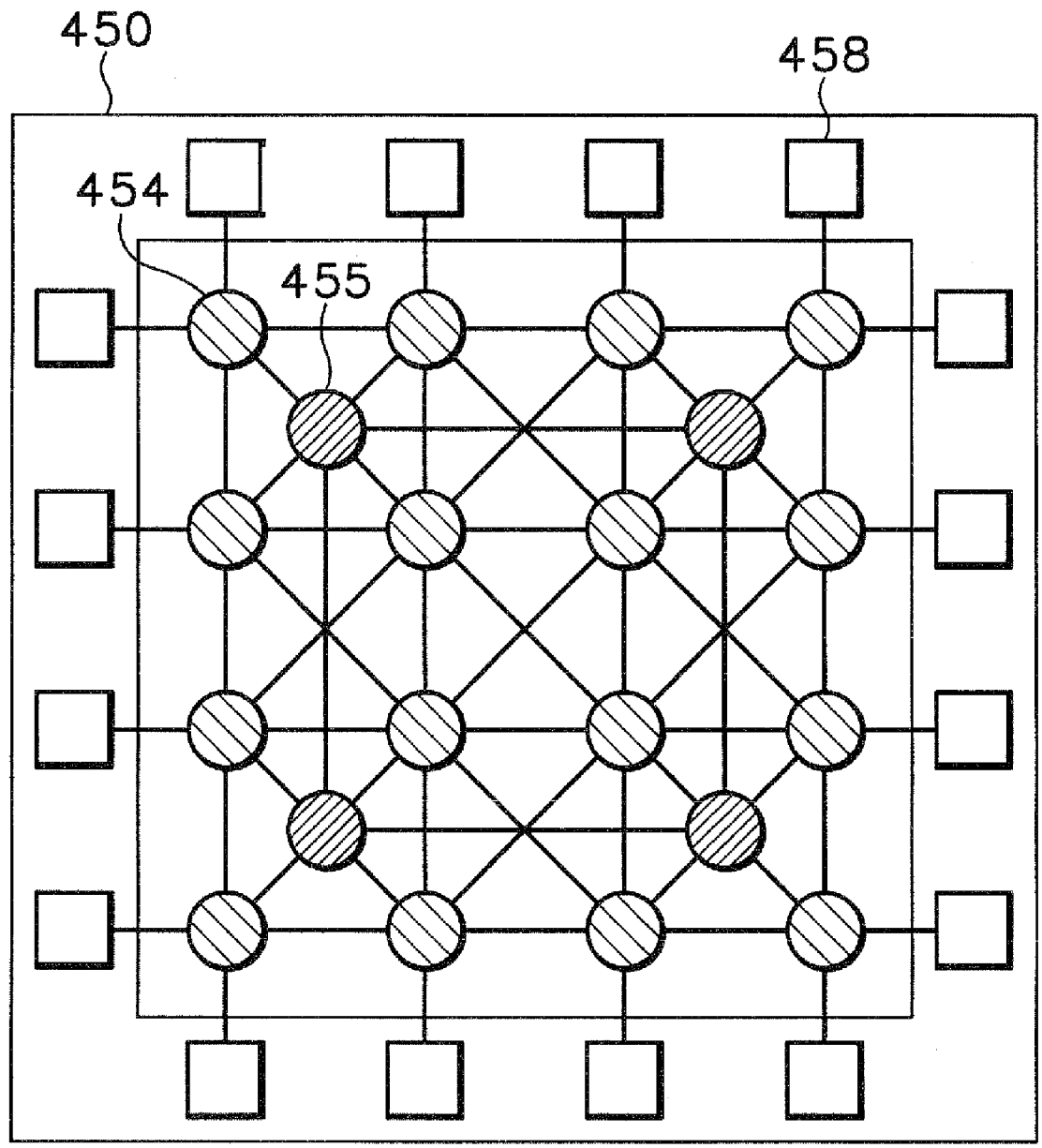
FIG. 25 illustrates an example re-configurable chip having a number of physically formed hardware objects.

The above-described hardware objects can be formed in silicon or on another substrate in a straightforward fashion. FIG. 25 illustrates an example chip 450 having a number of physically formed instances of hardware objects 454 and 455. The objects are interconnected by data lines linked between protocol registers, which can have the properties of other protocol registers described above. Input and output pins 458 provide an interface to the chip 450. Standard communication protocols, such as USB or Firewire could be connected to the chip 450 by including particularized hardware objects 454 programmed to perform the particular connection protocols.

The particular mix of objects 454 and 455 formed on the chip 450 can vary depending on the type of application served by the chip 450. However, modern technologies can support very large numbers of physical objects, thus making the applicability wide-ranging. Because the hardware objects on the hardware chip 450 can be relatively easily configured and re-configured, the chip 450 can be referred to as a Re-configurable Standard Part, or RSP. The total number of physical hardware object instances implemented on the RSP may be on the order of 100-100,000 or more. The total number of different physical hardware objects (in this example only two) will be much fewer, for example on the order of 10. Of course, any number of types or total number of hardware objects can be implemented on the RSP without deviating from the inventive concepts described herein.

By selecting which hardware objects are made on a base RSP, particular RSPs can be optimized for particular markets. A common example is trading-off on-chip memory capacity for computation hardware. For example, an RSP having a multitude of compute physical hardware objects such as adders, shifters and multipliers, could be useful in the DSP (Digital Signal Processing) market. In another case, having more on-chip memory would be useful in network routing markets, where storing large data-sets and buffering network packets is more important than pure mathematical computation.

Software Objects

Once the hardware objects are defined, embodiments of the invention allow systems to be built by developing a description of interconnected hardware objects. Ultimately, this description is loaded onto an RSP, described above, and a fully programmed, very specific system is produced, using a very general architecture. Once programmed, the RSP system is complete and ready for operation.

To create the system of interconnected hardware objects, software descriptions of the hardware object definitions are stored in an object library. An example library is illustrated in FIG. 26. Illustrated in that figure is a collection of library objects, A, B, C, and D. The library objects are pre-defined collections of primitive object descriptions. The existence of the unique messaging protocols and encapsulation of each hardware object as described above enables software object descriptions of the hardware objects to be already built-in to the hardware object.

Essential properties of a software object that are embodied in the invention include independent execution, asynchronous messaging between objects, encapsulation and insensitivity to context.

Independent execution is a critical quality that removes software from the operation of the underlying hardware it runs on, allowing many different software architectures to be effectively implemented with no hardware restrictions.

Asynchronous messaging is important because it allows the software description to be independent of all of the traditional timing issues in hardware design. Further, it forces any real-time software functionality to be explicitly defined in the software, rather than having "real-time" defined by a number of processor cycles.

Encapsulation and insensitivity to context allow the software objects to have identical functionality and performance independent of the physical location of the hardware implementation on an IC and independent of the particular IC type. Once a hardware object can be built that:

has built-in encapsulation,
is insensitive to context,
operates independently,
communicates asynchronously,
is genuinely re-locatable,
can be any size,
can be any complexity, it is relatively easy to build hardware object inheritance, polymorphism and modularity by simply using a software description that supports Object Oriented Programming (OOP). Thus the hardware objects have software descriptions that rigidly adhere to the OOP principals.

There is no functional difference between an object in a hardware view and in a software view. All hardware objects can be considered purely as instantiations of the Object Library software primitives. All software objects can be considered as pure descriptions of fully encapsulated hardware objects. In embodiments of the invention, there is a full, provable, one-to-one mapping between the hardware and software views. The hardware/software dichotomy in the described development system is a true bottom-up construction based on rules and relations of the protocol registers and the base hardware objects. All the software behaviors and all the hardware specific information of the hardware objects are contained within the object definition - they are stored centrally and can be inherited. This allows new objects to be created, since all the hardware rules and relations can be inherited from the child instances.

FIG. 26 illustrates that object A is made of four interconnected primitive objects, three of which being primitive type #1 and one of which being type #2. Once object A is placed in the library, the object itself is available to be used by further objects. For example, object B, similar to object A, is also shown as a collection of other primitive objects, while object D is a collection of objects A and B, only, and does not directly instance any primitive objects. These hierarchical relationships preserve all the OOP properties, such as inheritance for example. Software objects stored in the library need not be limited to primitive objects, however. This is illustrated in object C's definition, which includes another library object B along with some additional interconnected primitive objects.

Software object hierarchy is also illustrated in FIG. 27, which shows a number of primitive objects collected hierarchically into a software object 460. The software object 462 is simply a single primitive object, while software objects 464 and 466 are made from two and three primitive objects, respectively.

New software objects for the library can be created by defining a new level of hierarchy and abstraction. Since all of the hardware specific rules and relations are inherited from the children, the hardware information for the new software object is automatically created. In practice, the Object Library can be developed in C++, Java, or any other another OOP Language.

System Development

An example software model of a complete system is illustrated in FIG. 28. That figure illustrates an MPEG2 decoder object 470 assembled from a collection of hardware primitives and pre-defined software objects from a video decoder portion of an object library. The video decoder library 480 includes the individual primitive objects P1-P7, along with a motion object 472 and a decompress object 474. The motion object 472 is created from two primitives P3 and P5, while the decompress object 474 is created from three primitives, P2, P4, and P6. The P6 primitive is a inverse Discrete Cosine Transform ($DCT^{-1}$) primitive object. Primitives P1 and P7 are input/output primitive objects. Assembling the decoder 470 also includes using an external frame store 476, which in some embodiments can be effected using off-chip memory. Further details are given below in reference to the implementation of the decoder.

The software model in FIG. 28 is a true OOP description of the system: the objects run independently and the code is simply a collection of object instances. Once a system is described using such a software model, it is both executable as a piece of software and has the structural information required to map the model efficiently onto hardware.

Once a software system that is a collection of software and, ultimately, hardware objects is created, the system is mapped onto an RSP 450 (FIG. 25) to make a hardware product. In operation, when the system designer designs the system model, he or she is using properties directly from the Object Library, which, in turn, were generated directly from properties of the underlying physical hardware objects. Therefore, when the system designer describes the desired system, the properties of the desired system will already have the properties of the underlying physical hardware objects built-in. This direct correspondence from the desired system to the underlying physical hardware objects makes mapping onto the RSP a relatively simple assignment process.

Figure 29:
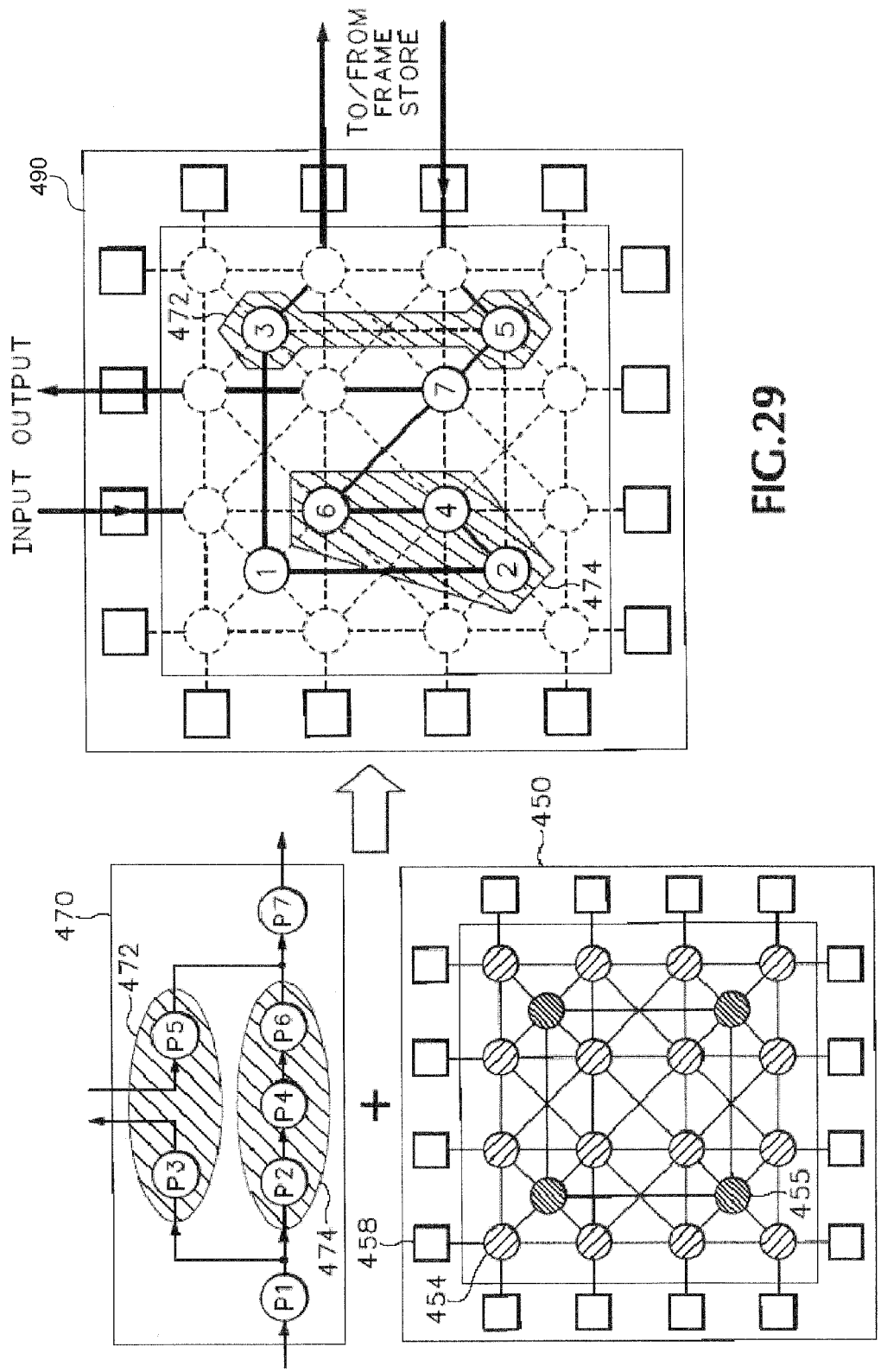
FIG. 29 is a block diagram illustrating how software objects are mapped onto a re-configurable chip.

An example mapping system is illustrated in FIG. 29, which illustrates the MPEG2 decoder object 470 of FIG. 28 being mapped onto the RSP 450 of FIG. 25 to yield system chip 490 programmed to be an MPEG2 decoder. Each of the primitive objects P1-P7 of the decoder object 470 is assigned to one of the hardware objects 454 and 455 of the RSP 450. The properties of the underlying physical hardware objects 454 and 455 when configured to be the primitive objects P1-P7 are the same properties used to develop the decoder 470 from the object library 480 (FIG. 28). Object P1 of the decoder 470 and the programmed physical hardware object 455 labeled "1" on RSP 450 are both input objects, accepting input messages to the system. Similarly, the object P7 and the programmed physical object 454 labeled "7" is an output object, which delivers the decoded video.

The primitive objects P2, P4 and P6 comprising the decompress object 474 are directly mapped to three physical hardware objects labeled "2", "4" and "6" respectively on the RSP 450. The hierarchical properties of the decompress object 474 is maintained on the RSP 450, shown as the shaded region 474. Similarly, the primitive objects P3 and P5 comprising the motion object 472 is directly mapped to two physical hardware objects labeled "3" and "5" respectively. The hierarchical properties of the motion object 472 is maintained on the RSP 450, shown in the shaded region 472.

The frame store 476 of FIG. 28 is this example was marked as being off-chip in the software model, and so is not mapped on the RSP 450, creating instead the interface signals marked "to/from frame store".

Not all the physical hardware objects 454 and 455 on the RSP 450 are used for every system implementation. Indeed, it is likely that many physical hardware objects will not be used. The unused physical hardware objects may be turned off, or may be set to run at extremely low clock rates to save power.

As described above, the hardware objects inherently contain the software object description, function and properties. Additionally, the hardware object has additional property requirements, specifically: a configuration binary program that makes the hardware perform the desired function; the amount of hardware resource needed; and the connection rules that govern how the hardware is connected. In one embodiment of the invention, there is only one version of the object with one possible underlying physical hardware object topology. In other embodiments, there are many different topologies and mixes of underlying physical hardware objects that can be programmed (using the configuration binary attached to the object) to create an object. In the latter case, the object is said to have different incarnations.

Each incarnation of an object has exactly the same software object built-in, but each has different possible hardware topologies and mixes which then creates different performance and resource utilization which can be traded by the user choosing particular incarnations.

Figure 30:
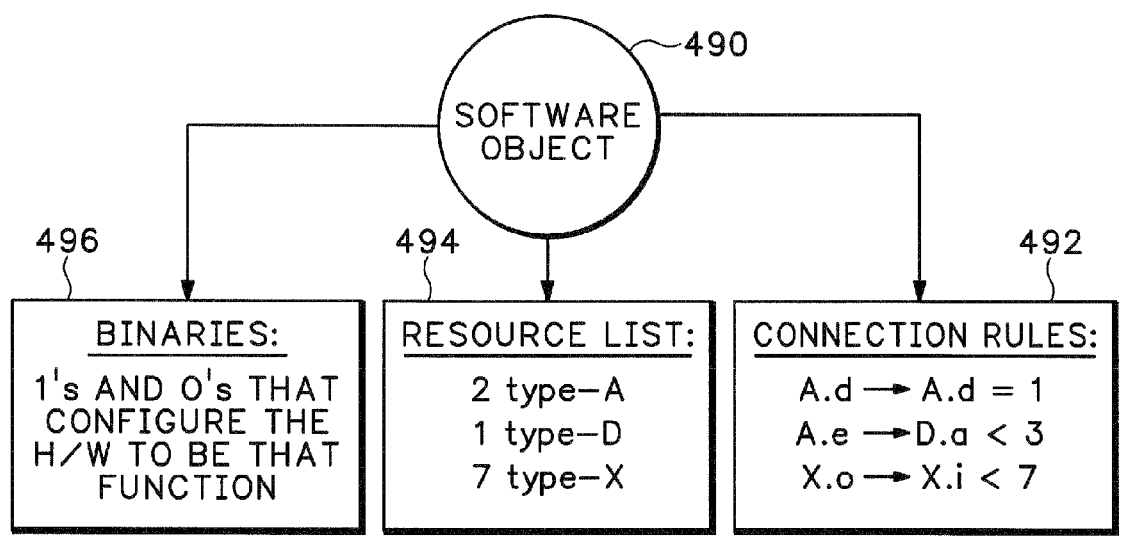
FIG. 30 is a block diagram illustrating additional information that can be attached to each software object system.

FIG. 30 illustrates the additional information that can be attached to one software object incarnation. A software object 490 is illustrated, which could be any type of object description, for example the decoder 470 of FIG. 28. As the software object 490 is developed, a physical hardware object topology is chosen, and a list of connection rules are generated. The connection rules specify the maximum and minimum delays that the topology can tolerate to meet a specific performance target, and must be met when the primitive objects are mapped directly onto the hardware of the RSP 450. As described with reference to the hardware objects above, there is a practical limit to the number of protocol registers that can be associated with each hardware object. Therefore, there is a corresponding limit to the level of interconnection for each hardware object. In other words, it is likely impossible that every hardware object on an RSP 450 is directly connected to every other hardware object used in the software object. Therefore, the list of connection rules 492 is used to ensure that objects that must be near one another (for example to meet performance requirements) can be, and objects that need not be directly connected do not have to be so connected. Referring to the list of connection rules 492 of FIG. 30, it shows that the link between A.d and A.d (two hardware objects' port "d") must be directly connected, i.e., have a connection length of exactly 1 hop. Other objects need not be so directly interconnected, and may be separated by up to 3, or up to 7 connections, respectively. In practice, if hardware objects that are not directly connected need to communicate with one another, they send a message with an address or routing commands to the desired hardware object.

A resource list 494 indicates how many and what type of the physical hardware objects on the RSP 450 form the topology of the software object incarnation. When the system is being designed, a design rules checker can be used that tracks available resources on an RSP 450, and prevents the system designer from exceeding in the design the number of resources that are physically available.

Both the connection rules 492 and the resource list 494 can easily be inferred from child primitives in a software object using inheritance. Only primitive objects have a defined topology.

A binaries list 496 is a list of micro-code or microinstructions that is loaded into instruction memory or configuration registers in the physical hardware object, and controls how the particular physical hardware object should operate. For instance, the micro-code can be stored in instruction order so that, when the hardware object is initiated, the first instruction read is the desired first instruction for the hardware object to perform.

Because the system software object model is isomorphic with the hardware objects on the RSP 450, the configured RSP 450 will operate exactly as simulated in the system model.

In practice, the binaries list 496 will typically be stored in some type of memory, be it EEPROM, flash, or other type of ROM, or in another type of memory located either on or off the RSP 450. When the RSP is powered, an initialization process first initializes all of the hardware objects to an initial state. One physical hardware object may be configured on reset to become a function that will automatically load initial instructions. The initial instructions are then executed to cause the top-level binaries list 496 to be loaded into the RSP 450. The binaries list can be distributed to the individual hardware objects using the message packet protocol described above. Once the first part of the binaries are loaded into their individual objects, the objects can start to operate, waiting for first input data.

Figure 31:
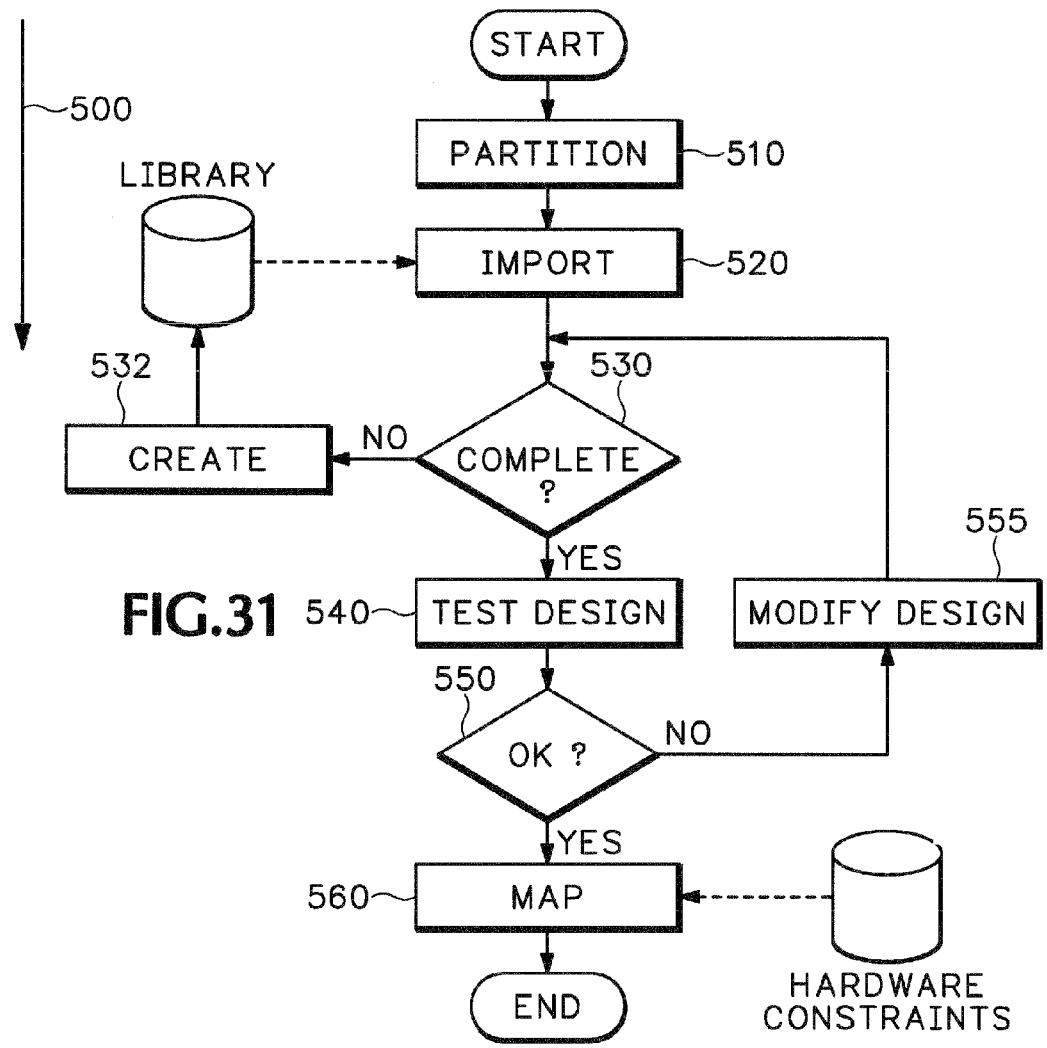
FIG. 31 is a flow diagram illustrating processes used in developing software systems for implementation on a re-configurable chip.

A flowchart explaining the processes used to create a fully programmed system is illustrated in FIG. 31. A flow 500 begins by partitioning the problem into its component parts in a process 510. Next, library objects are imported into the design system in a process 520. As the design is being developed, the designer determines if there are the correct software objects present in the library in a decision 530. If necessary objects are not present, for example the object does not yet exist or a new performance incarnation is needed, the designer can create them in a process 532 and store the newly created objects in the library. After the design is complete and all the necessary objects are included in the library the design is tested in a process 540. The design is checked in a process 550. If the design does not pass the design test, for example the connection rules cannot be met, the flow 500 loops back and new object incarnations can be created in a process 555 and the design tested. Once the design is complete, a list of hardware constraints from the RSP 450 is matched with the design features to be mapped onto the programmed RSP in a process 560, as described above.

Embodiments of this invention are particularly well suited for high data throughput applications, because the collection of hardware objects on the RSP 450 run asynchronously with massive parallelism. This creates incredible potential for very large systems that manipulate large amounts of data using complex algorithms. Some particularly well suited potential applications include motion estimation for video encoding, high-definition video encoding and processing, raster algorithms for laser writers, accelerators for high-speed wireless networks, ultra-secure encryption, storage area networks, HDTV video scaling, FEC for 802.13 and 802.11g and other wireless protocols, SNORT intrusion detection, and temporal video interpolation for display rate changes, for instance.

A major aspect of embodiments of the invention is completeness, with an inherent ability to both build high-performance integrated circuits and to change them using only software. Completeness means that the software-hardware co-design problem is eliminated by only using a software description.

Using embodiments of the invention, software and hardware views, and their implementation, are one and the same. This allows the user of the development system to write programs using standard tools and languages and then to directly implement them in hardware, with all its attendant performance benefits.

Users of embodiments of the invention do not need to have any hardware knowledge or expertise. Such a user simply writes or manipulates software to create a system, which can be as complex as very high-performance systems that only a custom IC can provide today. Once the system is defined in software, the software definition is used to configure a general purpose IC that is created with a collection of pre-existing physical hardware objects. The combination of a unique general-purpose chip, the RSP, coupled with a software library of objects allows the user to quickly design and test a system that could not be designed nearly as easily, or with as much performance, using present day tools.

EXAMPLE IMPLEMENTATION

FIGS. 32, 33, 34 and 35 illustrate an example of how a relatively complex object can be built using simple objects. The example object is one which convolves two streams together to create a filtered version of the two streams. Convolution in the time domain is equivalent to multiplication in the frequency domain, and is used in applications where multiple filters are cascaded, such as in wireless communication systems. The goal of the design is to create the convolution object so that more than one hardware multiplier can be kept busy without having global connections which broadcast the same value to many component objects at the same time.

Figure 32:
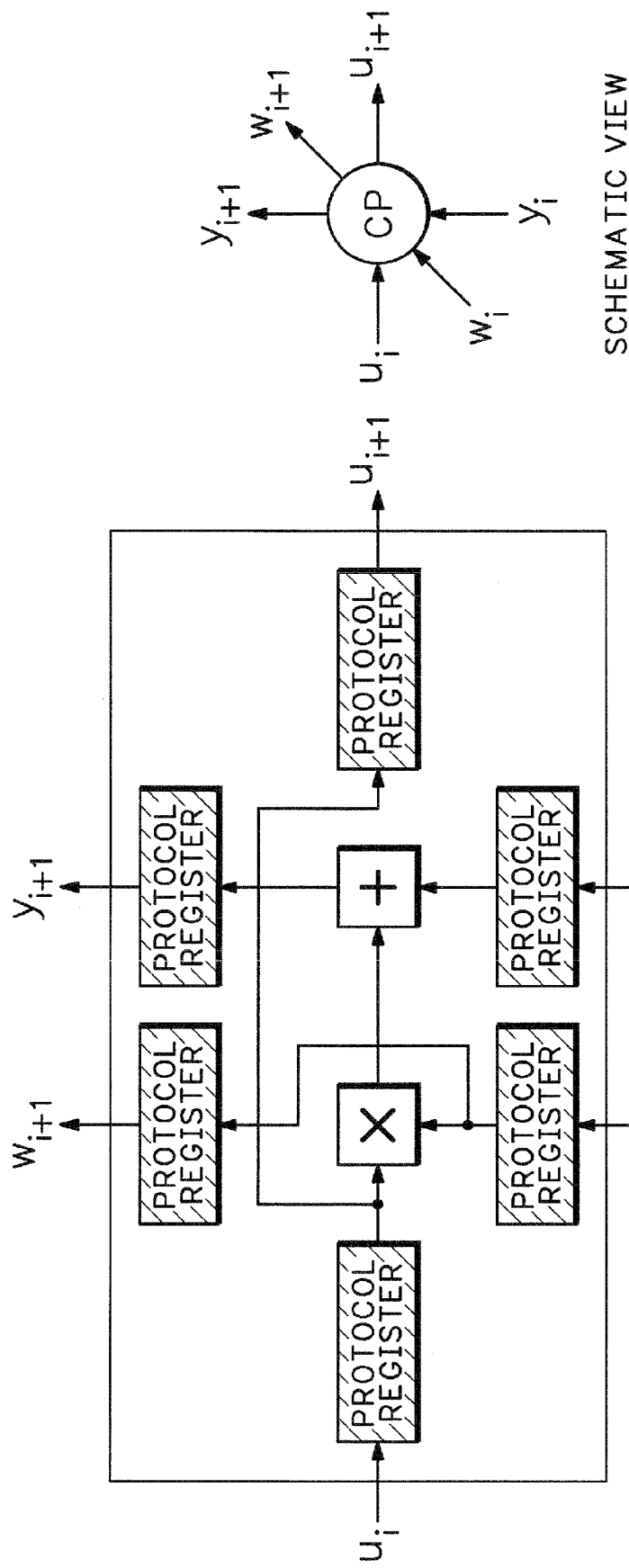

FIG. 32 shows a convolution primitive object. There are six protocol registers forming three input ports (labeled $u_i$, $w_i$ and $y_i$) and three output ports (labeled $w_{i+1}$, $u_{i+1}$ and $y_{i+1}$). The circuitry in the hardware object is one hardware multiplier and one adder. The connections in the hardware object are configured to perform the following operations:

$$w_{i+1}=w_i$$

$$u_{i+1}=u_i$$

$$y_{i+1}=u_i*w_i+y_i$$

FIG. 32 also shows a schematic view of the object which illustrates the input and output ports and the primitive labeled as "CP".

FIG. 33 shows pseudo-code for convolution primitive object of FIG. 32. The ports are declared as being INPORT or OUTPORT connections of type CHANNEL. The local variables ui, wi and yi are declared as being type integer. The first code line in the procedure is a join function of channel a and channel b. The join function does not complete until both channels a and b have valid inputs. The value received on channel a is assigned to the variable ui and the value received on channel b is assigned to the variable wi. The next two lines copy ui and wi to the output channels d and e respectively. The line "c→yi" is equivalent to another join function with the output of the multiply hardware, and could have been incorporated in the first line by using "join(a→ui,b→wi,c→yi)", but separating the two as shown in FIG. 33 allows the multiply hardware to proceed even if the input on channel c has not yet occurred. The final line indicates the value ui*wi+yi being output on channel f.

Figure 34:
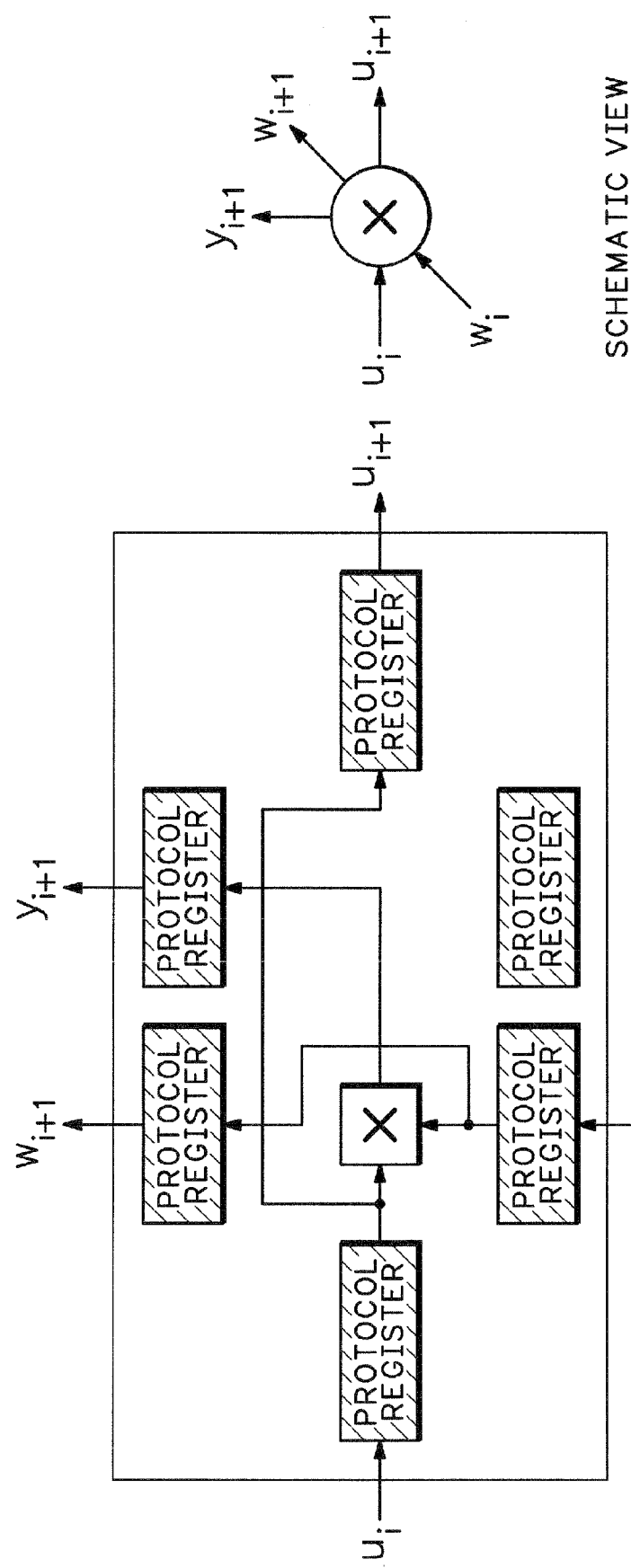

FIG. 34 shows the other primitive object used in this example. There are five (of the six available) protocol registers forming two input ports (labeled $u_i$ and $w_i$) and three output ports (labeled $w_{i+1}$, $u_{i+1}$ and $y_{i+1}$). The circuitry in the hardware object is just one hardware multiplier. The connections in the hardware object are configured to perform the following operations:

$$w_{i+1}=w_i$$

$$u_{i+1}=u_i$$

$$y_{i+1}=u_i*w_i$$

FIG. 34 also shows a schematic view of the object which illustrates the input and output ports and the primitive labeled as "X", shorthand for "multiply".

FIG. 35 shows how the two primitive objects in FIGS. 32 and 34 are combined in a topology to create the convolution object. Note that all of the connections remain point-point which keeps the wiring simple and allows the performance to be dictated by the primitive objects, not by the connections of the global wiring.

The function of the convolution object is given by the equation:

$$y(j) = \sum_{k=0}^{j} u(k)w(j-k)$$

$$0 \le j < 7$$

In the FIG. 35 example it is assumed that w(i) and u(i) are zero for i>3 for simplicity, but in a real streaming system more input values than the first four can be used. If we expand the series, each of the output terms is given by the following sets of equations:

$$y(0)=u(0)*w(0)$$

$$y(1)=u(0)*w(1)+u(1)*w(0)$$

$$y(2)=u(0)*w(2)+u(1)*w(1)+u(2)*w(0)$$

$$y(3)=u(0)*w(3)+u(1)*w(2)+u(2)*w(1)+u(3)*w(0)$$

$$y(4)=u(1)*w(3)+u(2)*w(2)+u(3)*w(1)$$

$$y(5)=u(2)*w(3)+u(3)*w(2)$$

$$y(6)=u(3)*w(3)$$

To show that the topology of FIG. 35 generates these terms correctly, first examine the output y(0). The output y(0) is created by the $y_{i+1}$ output of primitive object 600, which is simply u(0)*w(0) as desired. Next examine the output y(1). The output y(1) is created by the $y_{i+1}$ output of primitive object 601, which is the function:

$$y(1)=y_{i+1}^{601}=u(1)*w_{i+1}^{600}+y_{i+1}^{602}$$

In the above equation the superscript indicates the particular object that creates that output. Object 600 and object 602 operate as follows:

$$w_{i+1}^{600}=w(0)$$

$$u_{i+1}^{600}=u(0)$$

$$y_{i+1}^{602}=u_{i+1}^{600}*w(1)$$

By combing the last four equations it is seen that:

$$y(1)=u(1)*w(0)+u(0)*w(1)$$

This process of Gaussian elimination continues for the rest for the outputs $y(2) \ldots y(6)$.

Implementation of the described system is straightforward to produce in light of the above disclosure. As always, implementation details are left to the system designer. Individual selection of particular hardware objects, protocol registers, message formats, etc., are implementation specific and may need to be discovered empirically. This invention represents a pioneering paradigm shift in the way systems are designed and implemented compared to present methods.

Thus, although particular embodiments for an integrated circuit development system including hardware and software objects has been discussed, it is not intended that such specific references be considered limitations on the scope of this invention, but rather the scope is determined by the following claims and their equivalents.

What is claimed is:

1. An integrated circuit, comprising:
a communication network including a plurality of clocked communication channel segments, at least some of the communication channel segments structured to operate at different clock rates; and
a plurality of microprocessor pairs each coupled between a single one of the plurality of communication channel segments of the communication network, each of the plurality of microprocessor pairs including microprocessors structured to operate independently from one another and at an independently controllable clock rate, and each microprocessor having:
more than one sending port structured to send a split outgoing data message from its associated processor over at least two communication channels of the communication network, each sending port including one or more sequential output registers, each sequential output register including:
a data register for storing a data portion of the outgoing data message,
a valid register for storing an indication of a validity of the data stored in the data register, and
an accept register for storing an indication that a subsequent element in the communication network is able to accept one of the outgoing data messages, and
more than one receiving port structured to receive incoming data messages for its associated processor from the communication network, each receiving port including one or more sequential input registers, each sequential input register including:
a data register for storing a data portion of the incoming messages,
a valid register for storing an indication of a validity of the data stored in the data register, and
an accept register for storing an indication that the sequential input register is able to accept one of the incoming data messages.

2. An integrated circuit according to claim 1 in which a clock rate of any of the plurality of microprocessors is independent of a clock rate of any of the plurality of communication channel segments in the communication network.

3. An integrated circuit according to claim 1 in which the at least one sending port is structured to retain the data message indefinitely until it receives the second protocol signal.

4. An integrated circuit according to claim 1 in which the one or more sequential output registers includes a packet register for storing an indication of whether the data stored in the data register is a member of a particular packet.

5. An integrated circuit according to claim 1 in which all of the at least two communication channels transport a portion of the split outgoing data message.

6. An integrated circuit according to claim 1 in which at least one of the incoming data messages comprises a processing instruction.

7. An integrated circuit according to claim 1 in which each sending port is structured to send the outgoing data message to a selected receiving port at any time that the selected receiving port is able to receive the outgoing data message.

8. An integrated circuit according to claim 1 in which each of the sending ports in the integrated circuit has approximately similar electrical loading characteristics.

9. An integrated circuit according to claim 1 in which each of the receiving ports in the integrated circuit has approximately similar electrical loading characteristics.

10. An integrated circuit according to claim 1 in which the split outgoing data message comprises a first full outgoing data message on a first of the at least two communication channels and a second full data message on a second of the at least two communication channels.

11. An integrated circuit according to claim 10 in which the first full data outgoing message and second full data message are identical.

12. An integrated circuit, comprising:
a communication network including a plurality of separate components, each component structured to carry data at controllable clock rates; and
a plurality of processors coupled to the communication network, each of the processors structured to operate based on information only within each processor and each of the processors structured to generate messages, each of the processors having:
at least two sending ports structured to send an outgoing data message from its associated processor over the communication network aligned to one of the clock intervals of the communication network, each sending port including one or more sequential output registers, each sequential output register including:
a data register for storing a data portion of the outgoing data message,
a valid register for storing an indication of a validity of the data stored in the data register, and
an accept register for storing an indication that a next processor connected over the communication network can accept the data message; and
at least two receiving ports structured to receive a split incoming data message for its associated processor from at least two components of the communication network, each receiving port including one or more sequential input registers, each sequential input register including:

a data register for storing a data portion of the incoming data message, a valid register for storing an indication of a validity of the data stored in the data register, and an accept register for storing an indication that a next object in the communication network can accept a portion of the split incoming data message.

13. An integrated circuit according to claim 12 in which any of the plurality of processors is structured to send data messages to any other of the plurality of processors through the communication network.

14. An integrated circuit according to claim 12 in which any of the plurality of processors is structured to send data messages to itself.

15. An integrated circuit according to claim 12 in which each sending port is structured to retain the data message indefinitely until one of the receiving ports sends a signal to the sending port that indicates the data message will be accepted and removed from the communication network.

16. An integrated circuit according to claim 12 in which one or more sequential output registers includes a packet register for storing an indication of whether the data stored in the data register is a member of a particular packet.

17. An integrated circuit according to claim 12 in which each of the plurality of processors is structured to generate messages at any time relative to each other processor.

18. An integrated circuit according to claim 12 in which each of the processors is structured to generate outgoing messages at any time relative to the clock rate of the communication network.

19. An integrated circuit according to claim 18 in which a generated outgoing data message is transmitted by the communication network at a next subsequent clock signal of the communication network after receiving the outgoing generated data message from the sending port.

20. An integrated circuit according to claim 12 in which each of the processors operates according to an independently controlled clock signal.

21. An integrated circuit according to claim 20 in which the clock signal for a first of the plurality of processors has a different frequency than the clock signal for a second of the plurality of processors.

22. An integrated circuit according to claim 20 in which a frequency of the clock signal for any of the processors is different from a frequency of a communication network clock.

23. An integrated circuit according to claim 12 in which all of the at least two components of the communication network transport a portion of the split incoming data message.

24. An integrated circuit according to claim 12 in which the incoming data message is interleaved across the at least two components of the communication network.

25. An integrated circuit according to claim 12 in which a first portion of the incoming data message is transmitted across a first of the at least two components of the communication network and in which a second portion of the incoming data message is transmitted across a second of the at least two components of the communication network.

* * * * *